(12) United States Patent
Friend et al.

(10) Patent No.: US 11,719,461 B2
(45) Date of Patent: Aug. 8, 2023

(54) THERMOSTAT USER CONTROLS

(71) Applicant: Johnson Controls Tyco IP Holdings LLP, Milwaukee, WI (US)

(72) Inventors: Richard David Friend, Levittown, PA (US); Justin C. Pasquale, West Chester, PA (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 0 days.

(21) Appl. No.: 16/788,798

(22) Filed: Feb. 12, 2020

(65) Prior Publication Data

US 2021/0207828 A1 Jul. 8, 2021

Related U.S. Application Data

(60) Provisional application No. 62/958,600, filed on Jan. 8, 2020.

(51) Int. Cl.
*F24F 11/64* (2018.01)
*F24F 11/65* (2018.01)
(Continued)

(52) U.S. Cl.
CPC .............. *F24F 11/89* (2018.01); *F24F 11/30* (2018.01); *F24F 11/46* (2018.01); *F24F 11/52* (2018.01); *F24F 11/54* (2018.01); *F24F 11/56* (2018.01); *F24F 11/64* (2018.01); *F24F 11/65* (2018.01); *G05B 19/042* (2013.01);
(Continued)

(58) Field of Classification Search
CPC .. G06F 3/04847; G06F 13/225; G06F 3/0482; G06F 3/03547; G06F 2203/04808; G06F 3/02; G06F 21/554; G06F 2203/04104; G06F 3/04186; G06F 1/3231; G06F 3/0236; G06F 3/0233; F24F 2221/32; F24F 11/30; F24F 11/65; F24F 11/54; F24F 11/52; F24F 11/56; F24F 11/64; G05B 19/0423; G05B 19/106; G05B 19/042; G05B 2219/23258; G05B 2219/2614
See application file for complete search history.

(56) References Cited

U.S. PATENT DOCUMENTS 2,888,537 A 5/1959 Mears
8,420,956 B2 4/2013 Alderson et al.
(Continued)

OTHER PUBLICATIONS

"Hive Active Heating—Thermostat User Guide," Centrica Connected Home Limited, England, 2017, 24 pages.

*Primary Examiner* — Darrin D Dunn
(74) *Attorney, Agent, or Firm* — Foley & Lardner LLP

(57) ABSTRACT

A control device for a building, the control device includes a single user interface configured to receive a first signal from a first user input and a second signal from a second user input. The control device further includes a processing circuit configured to receive both the first signal and the second signal within a predetermined period of time. The processing circuit is further configured to perform a first action based on the first signal when the first signal is received before the second signal and not perform a second action in response to the second signal and perform the second action based on the second signal when the second signal is received before the first signal and not perform the first action in response to the first signal.

19 Claims, 29 Drawing Sheets

(51) Int. Cl.

| | | |
|---|---|---|
| *G05B 19/042* | (2006.01) | |
| *F24F 11/89* | (2018.01) | |
| *H05K 5/02* | (2006.01) | |
| *F24F 11/52* | (2018.01) | |
| *F24F 11/46* | (2018.01) | |
| *F24F 11/56* | (2018.01) | |
| *F24F 11/30* | (2018.01) | |
| *F24F 11/54* | (2018.01) | |
| *F24F 110/10* | (2018.01) | |
| *F24F 140/60* | (2018.01) | |
| *F24F 120/20* | (2018.01) | |
| *F24F 140/50* | (2018.01) | |

(52) U.S. Cl.
CPC ....... *G05B 19/0426* (2013.01); *H05K 5/0204* (2013.01); *F24F 2110/10* (2018.01); *F24F 2120/20* (2018.01); *F24F 2140/50* (2018.01); *F24F 2140/60* (2018.01); *G05B 2219/23258* (2013.01); *G05B 2219/2614* (2013.01)

(56) References Cited

U.S. PATENT DOCUMENTS

| | | |
|---|---|---|
| 8,802,981 B2 | 8/2014 | Wallaert et al. |
| 9,941,183 B2 | 4/2018 | Read et al. |
| 10,024,568 B1 | 7/2018 | Read et al. |
| 10,648,615 B1 | 5/2020 | Conklin et al. |
| 2005/0165601 A1* | 7/2005 | Gupta ............... G10L 15/26 704/E15.045 |
| 2007/0158442 A1* | 7/2007 | Chapman ........... G05D 23/1902 236/1 C |
| 2009/0271365 A1 | 10/2009 | Chen et al. |
| 2010/0064061 A1* | 3/2010 | Warren ............... G06F 3/0418 710/5 |
| 2010/0289643 A1 | 11/2010 | Trundle et al. |
| 2011/0069010 A1* | 3/2011 | Yi ..................... G06F 3/041 345/169 |
| 2011/0184574 A1 | 7/2011 | Le Roux et al. |
| 2012/0232969 A1 | 9/2012 | Fadell et al. |
| 2014/0145978 A1* | 5/2014 | Hsu ................... G06F 3/0416 345/173 |
| 2015/0095820 A1 | 4/2015 | Fellman |
| 2015/0339917 A1 | 11/2015 | Messing et al. |
| 2016/0048215 A1* | 2/2016 | Shin ................... H04M 1/724 345/156 |
| 2016/0055105 A1* | 2/2016 | Hsieh ............... G06F 13/225 710/244 |
| 2017/0082313 A1* | 3/2017 | Benichou ............ F24F 11/62 |
| 2017/0328591 A1 | 11/2017 | Kelly et al. |
| 2018/0136676 A1* | 5/2018 | Sloo ................. G06F 3/04847 |
| 2018/0260188 A1* | 9/2018 | Rossbacher ........... H03G 3/02 |
| 2018/0283723 A1 | 10/2018 | Ock et al. |
| 2019/0364173 A1* | 11/2019 | Fleizach ............. G06F 3/04883 |
| 2020/0233500 A1* | 7/2020 | Mannby ............. G06F 3/0233 |

\* cited by examiner

THERMOSTAT USER CONTROLS

CROSS-REFERENCE TO RELATED APPLICATION

The present application claims the benefit of and priority to U.S. Provisional Application No. 62/958,600, filed Jan. 8, 2020, which is incorporated by reference herein in its entirety for all purposes.

BACKGROUND

The present disclosure relates generally to building systems that control environmental conditions of a building. The present disclosure relates more particularly to thermostats of a building system.

Systems of a building may include various controllers configured to generate control decisions for heating or cooling equipment or systems. The controllers can, in some cases, be thermostats. Thermostats can be utilized in both residential and commercial building systems. Thermostats can receive, or themselves measure, environmental conditions such as temperature and generate control decisions based on setpoints and/or the measured temperature for operating the heating or cooling equipment or systems. Thermostats include physical displays for presenting measured or control information to a user and for receiving input from the user, e.g., a user desired setpoint or operating schedule.

SUMMARY

One embodiment of the present disclosure is a control device for a building. The control device includes a single user interface configured to receive a first signal from a first user input and a second signal from a second user input. The control device further includes a processing circuit configured to receive, via the user interface, both the first signal and the second signal within a predetermined period of time, perform a first action based on the first signal when the first signal is received before the second signal and not perform a second action in response to the second signal, perform the second action based on the second signal when the second signal is received before the first signal and not perform the first action in response to the first signal.

In some embodiments, either the first signal or the second signal navigates, via the user interface, directly to a menu, wherein the menu comprises further navigation to control device settings and does not include further navigation to other menus.

In some embodiments, the processing circuit is further configured to provide, via the user interface, control device information, wherein the control device information is based on, in part, the first signal and the second signal, wherein the control device information is comprises one or more substantially larger icons, numbers, or letters.

In some embodiments, the user interface comprises a dial and the first user input is received via depression of the dial and the second input is received via rotation of the dial.

In some embodiments, the control device further includes one or more icons, numbers, or letters configured to indicate the mode of operation for the control device, wherein the mode of operation is based on the first signal or the second signal or both.

In some embodiments, performing a first action based on the first signal further includes scrolling through temperature setpoints or navigating one or more menu structures.

In some embodiments, performing a second action based on the second signal further includes navigating directly to a menu or selecting a temperature setting, wherein the temperature setting comprises a temperature setpoint or a mode of operation.

In some embodiments, the control device is a thermostat for a heating, ventilation, or air conditioning (HVAC) system.

Another embodiment of the present disclosure is a thermostat for a building. The thermostat includes a user interface comprising a dial, the dial configured to rotate about an axis and translate along the axis, wherein rotating the dial provides a first command signal to a processing circuit and translating the dial provides a second command signal to the processing circuit. The thermostat further includes a processing circuit. The processing circuit is configured to receive, via the user interface, both the first command signal and the second command signal within a predetermined period of time, perform a first action based on the first command signal when the first command signal is received before the second command signal and not perform a second action in response to the second command signal, perform the second action based on the second command signal when the second command signal is received before the first command signal and not perform the first action in response to the first command signal.

In some embodiments, either the first signal or the second signal navigates, via the user interface, directly to a menu, wherein the menu comprises further navigation to control device settings and does not include further navigation to other menus.

In some embodiments, the processing circuit is further configured to provide, via the user interface, control device information, wherein the control device information is based on, in part, the first signal and the second signal, wherein the control device information is comprises one or more substantially larger icons, numbers, or letters.

In some embodiments, the thermostat further includes one or more icons, numbers, or letters configured to indicate the mode of operation for the control device, wherein the mode of operation is based on the first signal or the second signal or both.

In some embodiments, performing a first action based on the first signal further includes scrolling through temperature setpoints or navigating one or more menu structures.

In some embodiments, performing a second action based on the second signal further includes navigating directly to a menu or selecting a temperature setting, wherein the temperature setting comprises a temperature setpoint or a mode of operation.

In some embodiments, the control device is a thermostat for a heating, ventilation, or air conditioning (HVAC) system.

Another embodiment of the present disclosure is a method for controlling building equipment in a heating, ventilation, or air conditioning (HVAC) system. The method includes receiving, via the user interface, both a first command signal and a second command signal within a predetermined period of time, scrolling through temperature setpoints or navigating one or more menu structures based on the first command signal when the first command signal is received before the second command signal and not perform a second action in response to the second command signal, and navigating directly to a menu or selecting a temperature setting, wherein the temperature setting comprises a temperature setpoint or a mode of operation based on the second command signal when the second command signal is received before the first command signal and not perform the first action in response to the first command signal.

In some embodiments, either the first signal or the second signal navigates, via the user interface, directly to a menu, wherein the menu comprises further navigation to control device settings and does not include further navigation to other menus.

In some embodiments, the method further includes providing, via the user interface, control device information, wherein the control device information is based on, in part, the first signal and the second signal, wherein the control device information is comprises one or more substantially larger icons, numbers, or letters.

In some embodiments, the method further includes displaying one or more icons, numbers, or letters configured to indicate the mode of operation for the control device, wherein the mode of operation is based on the first signal or the second signal or both.

In some embodiments, the method further includes operating within a heating, ventilation, or air conditioning (HVAC) system.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Overview

Referring generally to the FIGURES, a thermostat control system for a residential heating and cooling system is shown. Residents of a building (e.g., home, campus, office, etc.) may control various temperatures of one or more zones within the building by means of a thermostat. The thermostat may include various mechanisms for interfacing with a user, which may include a mechanical input device (e.g., knob, dial, etc.). At times, users will interface with a thermostat and accidentally input more than one signal to the thermostat processor within a short period of time. There exists a need to both differentiate between signals provided in short periods of time and provide control logic to handle more than one signal provided in a substantially short period of time.

Commercial and Residential HVAC Systems with a Thermostat

Figure 1:
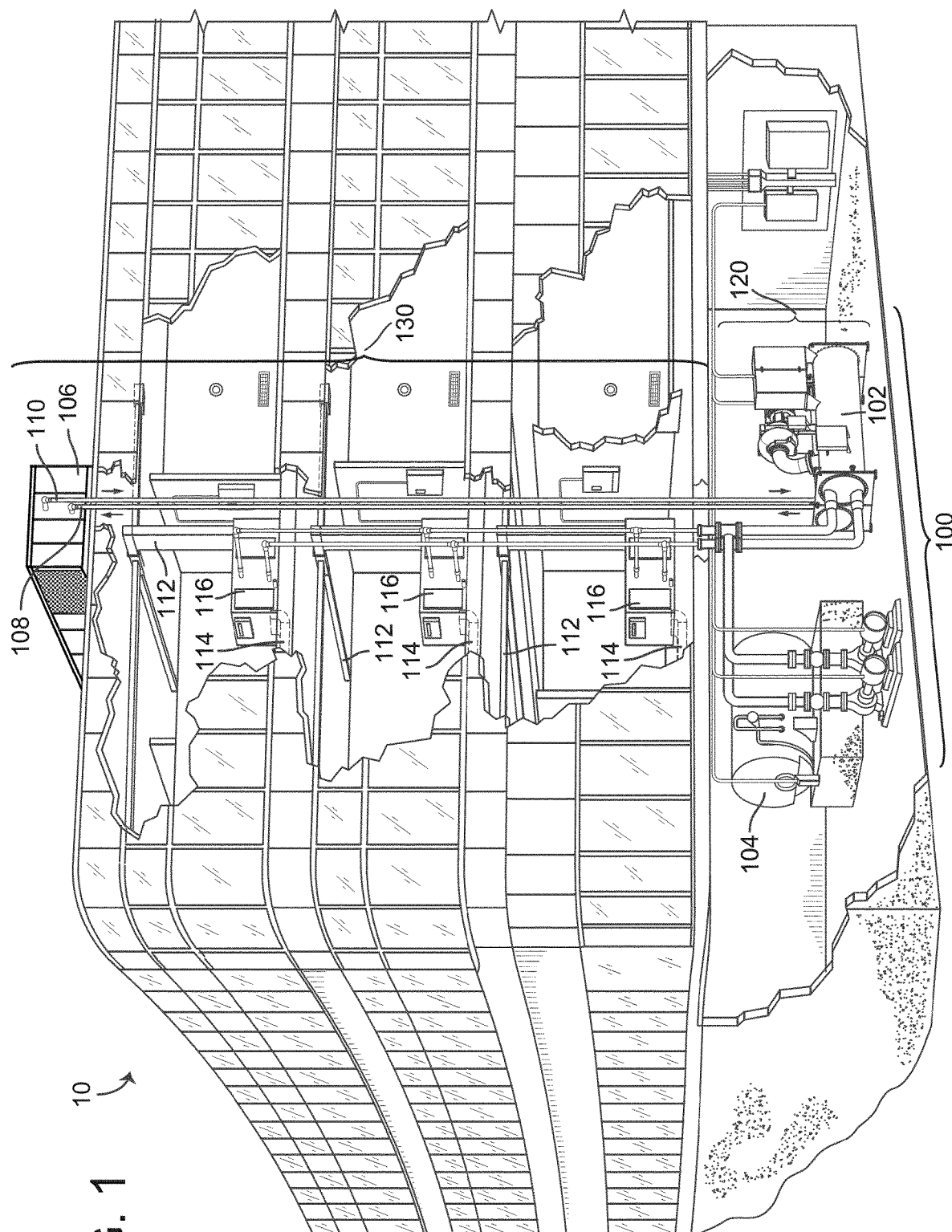
FIG. 1 is a perspective schematic drawing of a building equipped with a HVAC system, according to an exemplary embodiment.

Referring now to FIG. 1, an exemplary building management system (BMS) and HVAC system in which the systems and methods of the present invention can be implemented are shown, according to an exemplary embodiment. In FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes an HVAC system 100. HVAC system 100 can include HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve set-point conditions for the building zone.

Figure 2:
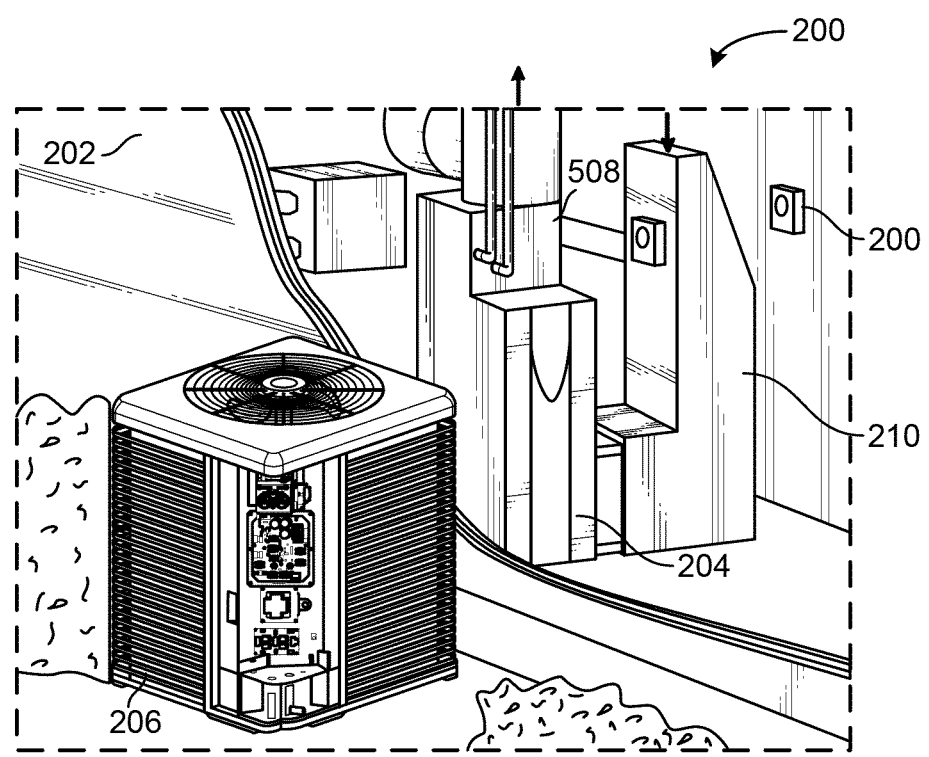
FIG. 2 is a perspective schematic drawing of a building equipped with a residential heating and cooling system, according to an exemplary embodiment.

Referring now to FIG. 2, a residential heating and cooling system 200 is shown, according to an exemplary embodiment. The residential heating and cooling system 200 may provide heated and cooled air to a residential structure. Although described as a residential heating and cooling system 200, embodiments of the systems and methods described herein can be utilized in a cooling unit or a heating unit in a variety of applications include commercial HVAC units (e.g., roof top units). In general, a residence 202 includes refrigerant conduits that operatively couple an indoor unit 204 to an outdoor unit 206. Indoor unit 204 may be positioned in a utility space, an attic, a basement, and so forth. Outdoor unit 206 is situated adjacent to a side of residence 202. Refrigerant conduits transfer refrigerant between indoor unit 204 and outdoor unit 206, typically transferring primarily liquid refrigerant in one direction and primarily vaporized refrigerant in an opposite direction.

When the system 200 shown in FIG. 2 is operating as an air conditioner, a coil in outdoor unit 206 serves as a condenser for recondensing vaporized refrigerant flowing from indoor unit 204 to outdoor unit 206 via one of the refrigerant conduits. In these applications, a coil of the indoor unit 204, designated by the reference numeral 208, serves as an evaporator coil. Evaporator coil 208 receives liquid refrigerant (which may be expanded by an expansion device, not shown) and evaporates the refrigerant before returning it to outdoor unit 206.

Outdoor unit 206 draws in environmental air through its sides, forces the air through the outer unit coil using a fan, and expels the air. When operating as an air conditioner, the air is heated by the condenser coil within the outdoor unit 206 and exits the top of the unit at a temperature higher than it entered the sides. Air is blown over indoor coil 208 and is then circulated through residence 202 by means of ductwork 210, as indicated by the arrows entering and exiting ductwork 210. The overall system 200 operates to maintain a desired temperature as set by thermostat 200. When the temperature sensed inside the residence 302 is higher than the set point on the thermostat 350 (with the addition of a relatively small tolerance), the air conditioner will become operative to refrigerate additional air for circulation through the residence 202. When the temperature reaches the set point (with the removal of a relatively small tolerance), the unit can stop the refrigeration cycle temporarily.

In some embodiments, the system 200 configured so that the outdoor unit 206 is controlled to achieve a more elegant control over temperature and humidity within the residence 202. The outdoor unit 206 is controlled to operate components within the outdoor unit 206, and the system 200, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

Figure 3:
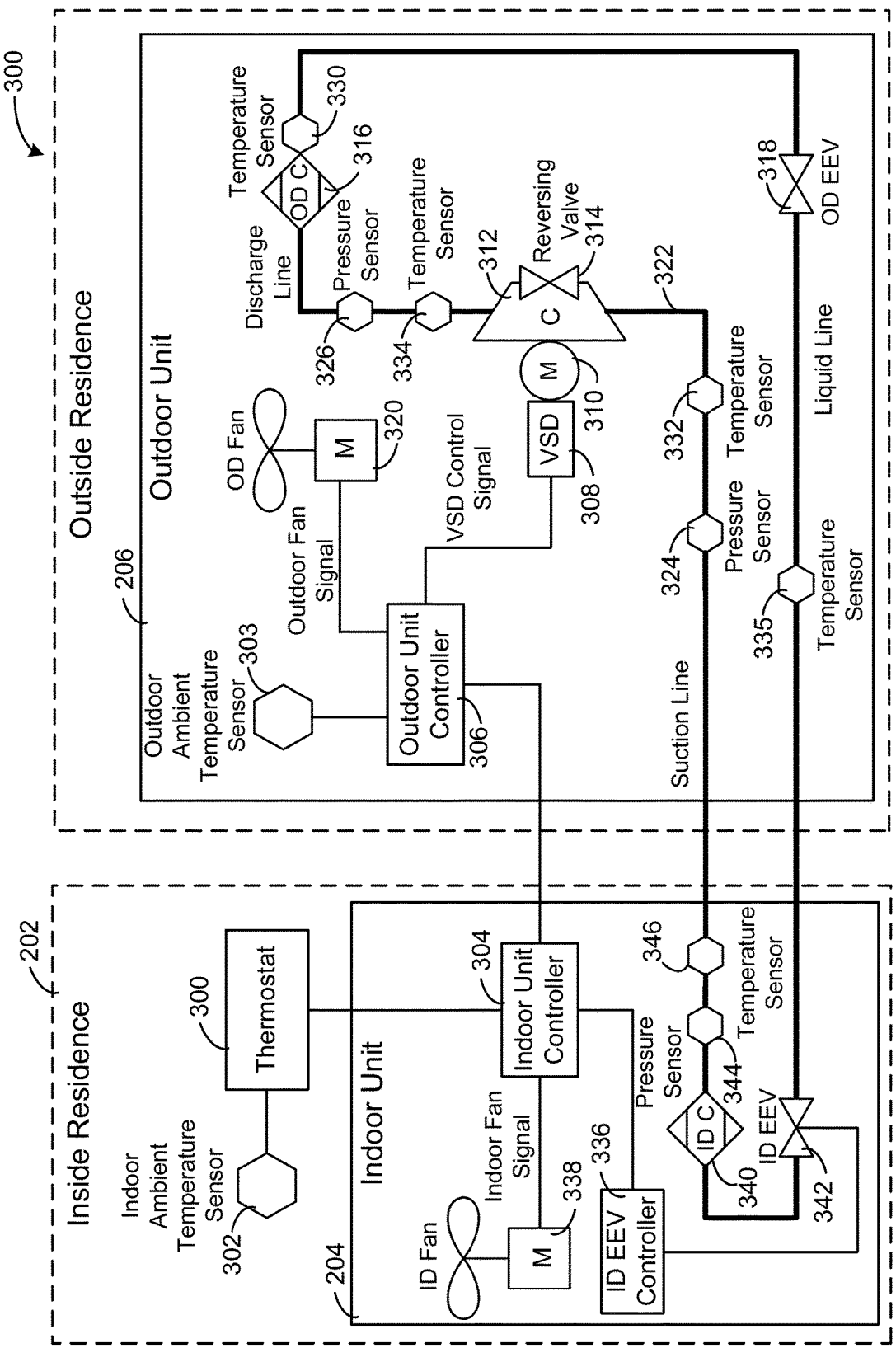
FIG. 3 is a schematic drawing of the thermostat and the residential heating and cooling system of FIG. 2, according to an exemplary embodiment.

Referring now to FIG. 3, an HVAC system 300 is shown according to an exemplary embodiment. Various components of system 300 are located inside residence 202 while other components are located outside residence 202. Outdoor unit 206, as described with reference to FIG. 2, is shown to be located outside residence 202 while indoor unit 204 and thermostat 350 are shown to be located inside the residence 202. In various embodiments, the thermostat 350 can cause the indoor unit 204 and the outdoor unit 206 to heat residence 202. In some embodiments, the thermostat 350 can cause the indoor unit 204 and the outdoor unit 206 to cool the residence 202. In other embodiments, the thermostat 350 can command an airflow change within the residence 202 to adjust the humidity within the residence 202.

The thermostat 350 can be configured to generate control signals for indoor unit 204 and/or outdoor unit 206. The thermostat 350 is shown to be connected to an indoor ambient temperature sensor 302, and an outdoor unit controller 306 is shown to be connected to an outdoor ambient temperature sensor 603. The indoor ambient temperature sensor 302 and the outdoor ambient temperature sensor 603 may be any kind of temperature sensor (e.g., thermistor, thermocouple, etc.). The thermostat 350 may measure the temperature of residence 202 via the indoor ambient temperature sensor 302. Further, the thermostat 350 can be configured to receive the temperature outside residence 202 via communication with the outdoor unit controller 306. In various embodiments, the thermostat 350 generates control signals for the indoor unit 204 and the outdoor unit 206 based on the indoor ambient temperature (e.g., measured via indoor ambient temperature sensor 302), the outdoor temperature (e.g., measured via the outdoor ambient temperature sensor 603), and/or a temperature set point.

The indoor unit 204 and the outdoor unit 206 may be electrically connected. Further, indoor unit 204 and outdoor unit 206 may be coupled via conduits 322. The outdoor unit 206 can be configured to compress refrigerant inside conduits 322 to either heat or cool the building based on the operating mode of the indoor unit 204 and the outdoor unit 206 (e.g., heat pump operation or air conditioning operation). The refrigerant inside conduits 322 may be any fluid that absorbs and extracts heat. For example, the refrigerant may be hydro fluorocarbon (HFC) based R-410A, R-407C, and/or R-134a.

The outdoor unit 206 is shown to include the outdoor unit controller 306, a variable speed drive 308, a motor 310 and a compressor 312. The outdoor unit 206 can be configured to control the compressor 312 and to further cause the compressor 312 to compress the refrigerant inside conduits 322. In this regard, the compressor 312 may be driven by the variable speed drive 308 and the motor 310. For example, the outdoor unit controller 306 can generate control signals for the variable speed drive 308. The variable speed drive 308 (e.g., an inverter, a variable frequency drive, etc.) may be an AC-AC inverter, a DC-AC inverter, and/or any other type of inverter. The variable speed drive 308 can be configured to vary the torque and/or speed of the motor 310 which in turn drives the speed and/or torque of compressor 312. The compressor 312 may be any suitable compressor such as a screw compressor, a reciprocating compressor, a rotary compressor, a swing link compressor, a scroll compressor, or a turbine compressor, etc.

In some embodiments, the outdoor unit controller 306 is configured to process data received from the thermostat 350 to determine operating values for components of the system 300, such as the compressor 312. In one embodiment, the outdoor unit controller 306 is configured to provide the determined operating values for the compressor 312 to the variable speed drive 308, which controls a speed of the compressor 312. The outdoor unit controller 306 is controlled to operate components within the outdoor unit 206, and the indoor unit 204, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

In some embodiments, the outdoor unit controller 306 can control a reversing valve 314 to operate system 300 as a heat pump or an air conditioner. For example, the outdoor unit controller 306 may cause reversing valve 314 to direct compressed refrigerant to the indoor coil 208 while in heat pump mode and to an outdoor coil 316 while in air conditioner mode. In this regard, the indoor coil 208 and the outdoor coil 316 can both act as condensers and evaporators depending on the operating mode (i.e., heat pump or air conditioner) of system 300.

Further, in various embodiments, outdoor unit controller 306 can be configured to control and/or receive data from an outdoor electronic expansion valve (EEV) 518. The outdoor electronic expansion valve 518 may be an expansion valve controlled by a stepper motor. In this regard, the outdoor unit controller 306 can be configured to generate a step signal (e.g., a PWM signal) for the outdoor electronic expansion valve 518. Based on the step signal, the outdoor electronic expansion valve 518 can be held fully open, fully closed, partial open, etc. In various embodiments, the outdoor unit controller 306 can be configured to generate step signal for the outdoor electronic expansion valve 518 based on a subcool and/or superheat value calculated from various temperatures and pressures measured in system 300. In one embodiment, the outdoor unit controller 306 is configured to control the position of the outdoor electronic expansion valve 518 based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The outdoor unit controller 306 can be configured to control and/or power outdoor fan 320. The outdoor fan 320 can be configured to blow air over the outdoor coil 316. In this regard, the outdoor unit controller 306 can control the amount of air blowing over the outdoor coil 316 by generating control signals to control the speed and/or torque of outdoor fan 320. In some embodiments, the control signals are pulse wave modulated signals (PWM), analog voltage signals (i.e., varying the amplitude of a DC or AC signal), and/or any other type of signal. In one embodiment, the outdoor unit controller 306 can control an operating value of the outdoor fan 320, such as speed, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The outdoor unit 206 may include one or more temperature sensors and one or more pressure sensors. The temperature sensors and pressure sensors may be electrical connected (i.e., via wires, via wireless communication, etc.) to the outdoor unit controller 306. In this regard, the outdoor unit controller 306 can be configured to measure and store the temperatures and pressures of the refrigerant at various locations of the conduits 322. The pressure sensors may be any kind of transducer that can be configured to sense the pressure of the refrigerant in the conduits 322. The outdoor unit 206 is shown to include pressure sensor 324. The pressure sensor 324 may measure the pressure of the refrigerant in conduit 322 in the suction line (i.e., a predefined distance from the inlet of compressor 312). Further, the outdoor unit 206 is shown to include pressure sensor 326. The pressure sensor 326 may be configured to measure the pressure of the refrigerant in conduits 322 on the discharge line (e.g., a predefined distance from the outlet of compressor 312).

The temperature sensors of outdoor unit 206 may include thermistors, thermocouples, and/or any other temperature sensing device. The outdoor unit 206 is shown to include temperature sensor 330, temperature sensor 332, temperature sensor 334, and temperature sensor 336. The temperature sensors (i.e., temperature sensor 330, temperature sensor 332, temperature sensor 335, and/or temperature sensor 346) can be configured to measure the temperature of the refrigerant at various locations inside conduits 322.

Referring now to the indoor unit 204, the indoor unit 204 is shown to include indoor unit controller 304, indoor electronic expansion valve controller 336, an indoor fan 338, an indoor coil 340, an indoor electronic expansion valve 342, a pressure sensor 344, and a temperature sensor 346. The indoor unit controller 304 can be configured to generate control signals for indoor electronic expansion valve controller 342. The signals may be set points (e.g., temperature set point, pressure set point, superheat set point, subcool set point, step value set point, etc.). In this regard, indoor electronic expansion valve controller 336 can be configured to generate control signals for indoor electronic expansion valve 342. In various embodiments, indoor electronic expansion valve 342 may be the same type of valve as outdoor electronic expansion valve 318. In this regard, indoor electronic expansion valve controller 336 can be configured to generate a step control signal (e.g., a PWM wave) for controlling the stepper motor of the indoor electronic expansion valve 342. In this regard, indoor electronic expansion valve controller 336 can be configured to fully open, fully close, or partially close the indoor electronic expansion valve 342 based on the step signal.

Indoor unit controller 304 can be configured to control indoor fan 338. The indoor fan 338 can be configured to blow air over indoor coil 340. In this regard, the indoor unit controller 304 can control the amount of air blowing over the indoor coil 340 by generating control signals to control the speed and/or torque of the indoor fan 338. In some embodiments, the control signals are pulse wave modulated signals (PWM), analog voltage signals (i.e., varying the amplitude of a DC or AC signal), and/or any other type of signal. In one embodiment, the indoor unit controller 304 may receive a signal from the outdoor unit controller indicating one or more operating values, such as speed for the indoor fan 338. In one embodiment, the operating value associated with the indoor fan 338 is an airflow, such as cubic feet per minute (CFM). In one embodiment, the outdoor unit controller 306 may determine the operating value of the indoor fan based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The indoor unit controller 304 may be electrically connected (e.g., wired connection, wireless connection, etc.) to pressure sensor 344 and/or temperature sensor 346. In this regard, the indoor unit controller 304 can take pressure and/or temperature sensing measurements via pressure sensor 344 and/or temperature sensor 346. In one embodiment, pressure sensor 344 and temperature sensor 346 are located on the suction line (i.e., a predefined distance from indoor coil 340). In other embodiments, the pressure sensor 344 and/or the temperature sensor 346 may be located on the liquid line (i.e., a predefined distance from indoor coil 340).

Figure 4:
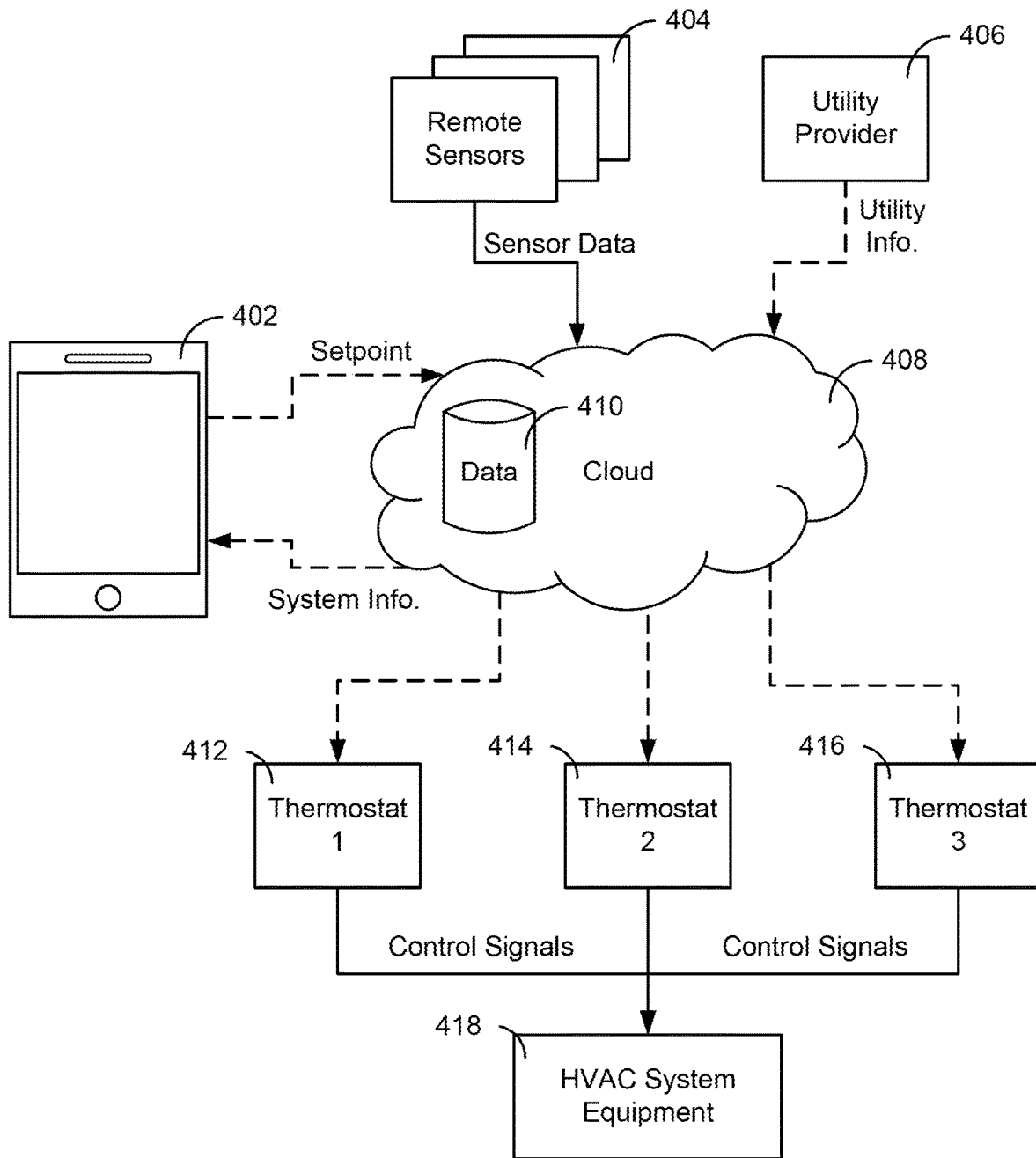
FIG. 4 is a block diagram of a thermostat control system which can be used in the system of FIG. 3, according to some embodiments.

Referring now to FIG. 4, a control system 400 is shown. Control system 400 is shown to include user device 402, remote sensors 404, utility provider 406, cloud 408, thermostats 412-416, and HVAC system 418. Control system 400 may include some or all of the functionality of HVAC system 300.

User device 402 may be any device capable of providing a user interface to a user (e.g., cellphone, tablet, laptop, computer, etc.). In some embodiments, user device 402 is a cellphone capable of downloading a thermostat application and providing that thermostat application to a user via the user interface of the cell phone.

Remote sensors 404 can be any type of device capable of recording/monitoring environmental data and transmitting that data back to a processing device. In some embodiments, remote sensors 404 record temperature data in one or more building zones (e.g., bathroom, office, basement, etc.) and provide the temperature data to a processing device. In some embodiments, the processing device (e.g., controller) may be located in cloud 408 as shown in FIG. 4. In other embodiments, the processing and controls of control system 400 is performed by an HVAC controller, such as controller 304, controller 306, or any other various controllers, either alone or in combination, as shown in FIG. 3.

Utility provider 406 can be any company capable of providing a utility (e.g., electricity, water, etc.) to a residence or building. In some embodiments, utility provider 406 provides one or more utilities to the residence in which control system 400 is located. Utility provider 406 may further provide utility information to a processing device in control system 400. For example, utility provider 406 may provide on and off-peak rates, utility benefits, and other promotional offers to user device 402 on a thermostat application, via a user interface on user device 402. The utility information may reside in cloud 408 until user device 402 requests the utility information.

Cloud 408 may include programming that relies on sharing computing resources rather than having local devices (e.g., local serves, local computers, etc.) handle applications. Cloud 410 may be responsible for sharing any applications, storage, services, or any other computational processing required in control system 400. In some embodiments, cloud 410 is a model for enabling on-demand network access to a shared pool of configurable computing resources (e.g., networks, servers, storage, applications, and services) that can be rapidly provisioned. Cloud 410 is shown to include data storage 410. Data storage 410 may store data from one or more elements of control system 400 (e.g., utility provider 406, remote sensors 404, etc.).

Thermostats 412-416 may be identical or substantially similar to one or more thermostats discloses in the present application (e.g., thermostat 350, thermostat 500). In some embodiments, thermostats 412-416 receive temperature setpoints from a controller within cloud 408, and provide control signals to various HVAC equipment (chillers, heaters, dampers, etc.) within HVAC system 418. Thermostats 412-416 may send information to and receive information from user device 402. For example, user device 402 may provide a temperature setpoint to thermostat 412, via the cloud 408.

Thermostat Control Features

Figure 5:
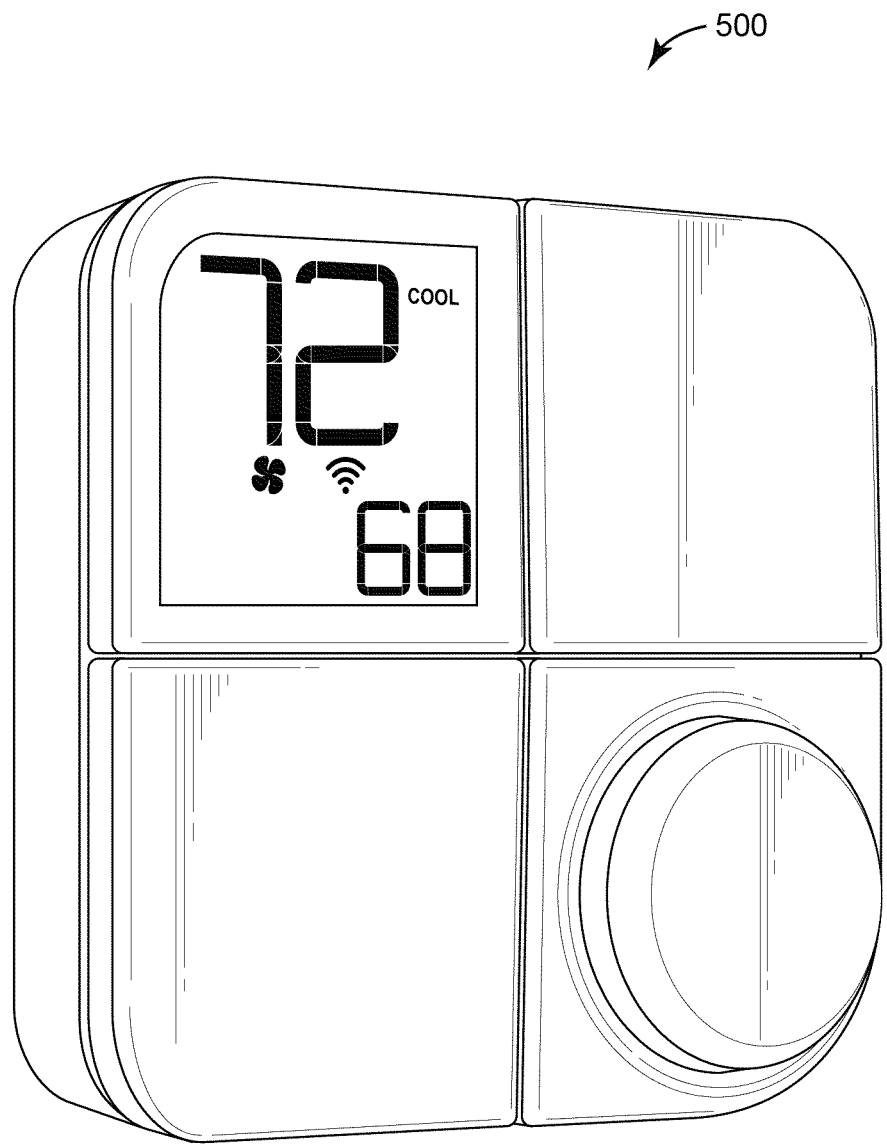
FIG. 5 is a perspective schematic drawing of a thermostat for a residential heating and cooling system, which can be used in the system of FIGS. 3-4, according to some embodiments.

Referring now to FIG. 5, a drawing of a thermostat 500 for controlling building equipment is shown, according to an exemplary embodiment. Thermostat 500 may be identical or substantially similar to thermostat 350.

Figure 6:
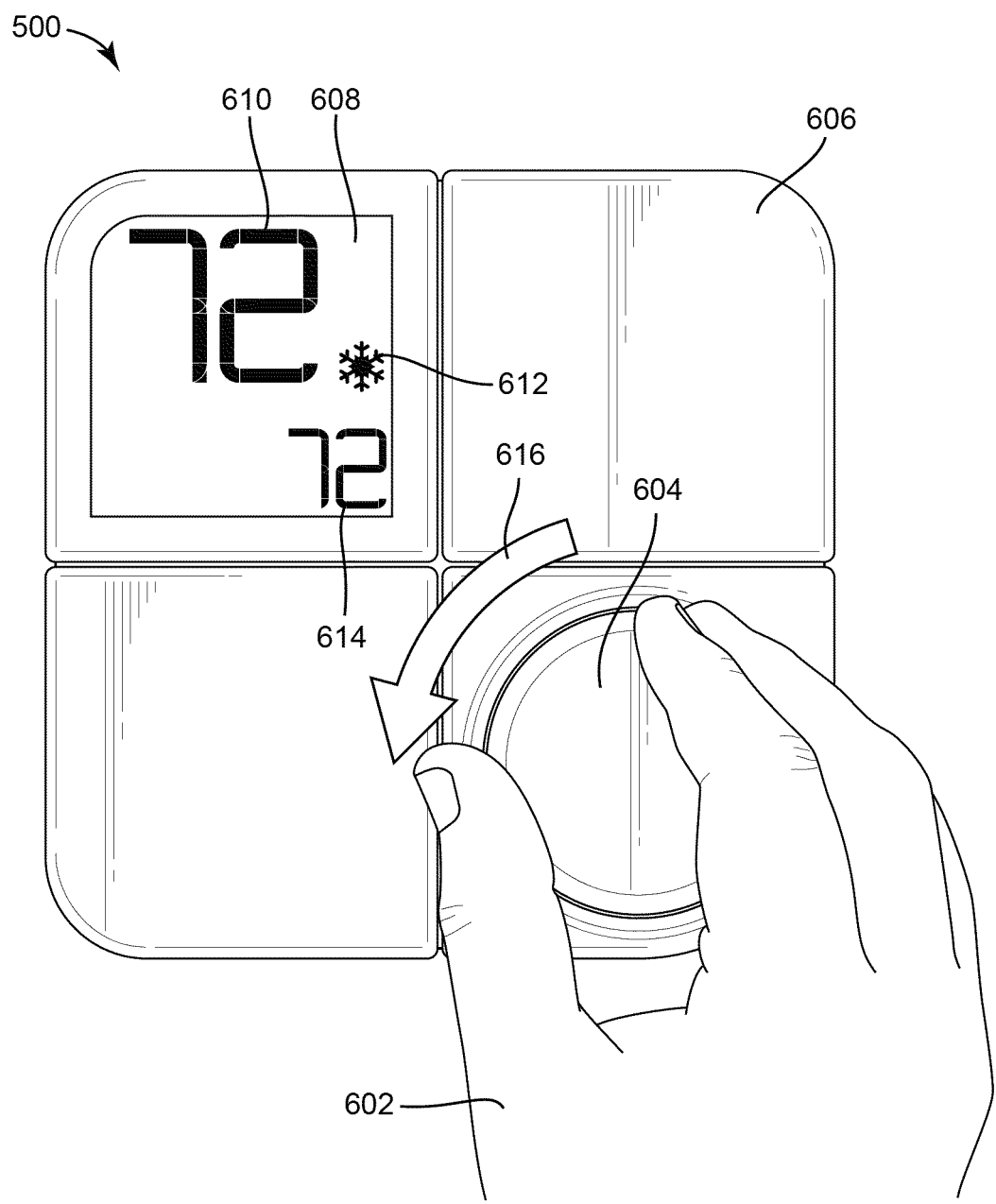
FIG. 6 is a perspective schematic drawing of a user interacting with a thermostat for a residential heating and cooling system, which can be used in the system of FIGS. 3-4, according to some embodiments.

Referring now to FIGS. 6-10, drawings of a user operating thermostat 500 is shown, according to an exemplary embodiments. Referring to FIG. 6, thermostat 500 is shown to include user 602, dial 604, housing 606, display 608, temperature display 610, indicator 612, temperature setpoint 614, and rotation 616.

User 602 can be any person, machine, or device capable of operating dial 604 to provide inputs to thermostat 500. In some embodiments, user 602 is the owner or resident of the home in which thermostat 500 resides. Dial 604 can be any device capable of providing inputs to thermostat 500. Dial 604 can be configured to rotate, translate, press, extend, or perform any other type of movement, and in various directions. For example, user 602 may press dial 604 to provide an input to thermostat 500. In other embodiments, user 602 may extend (i.e., pull) dial 604 to provide an input to thermostat 500. As shown in FIG. 6, user 602 rotates dial 604 to provide an input to thermostat 500. Housing 606 may be any physical device containing and housing the components of thermostat 500.

Figure 12:
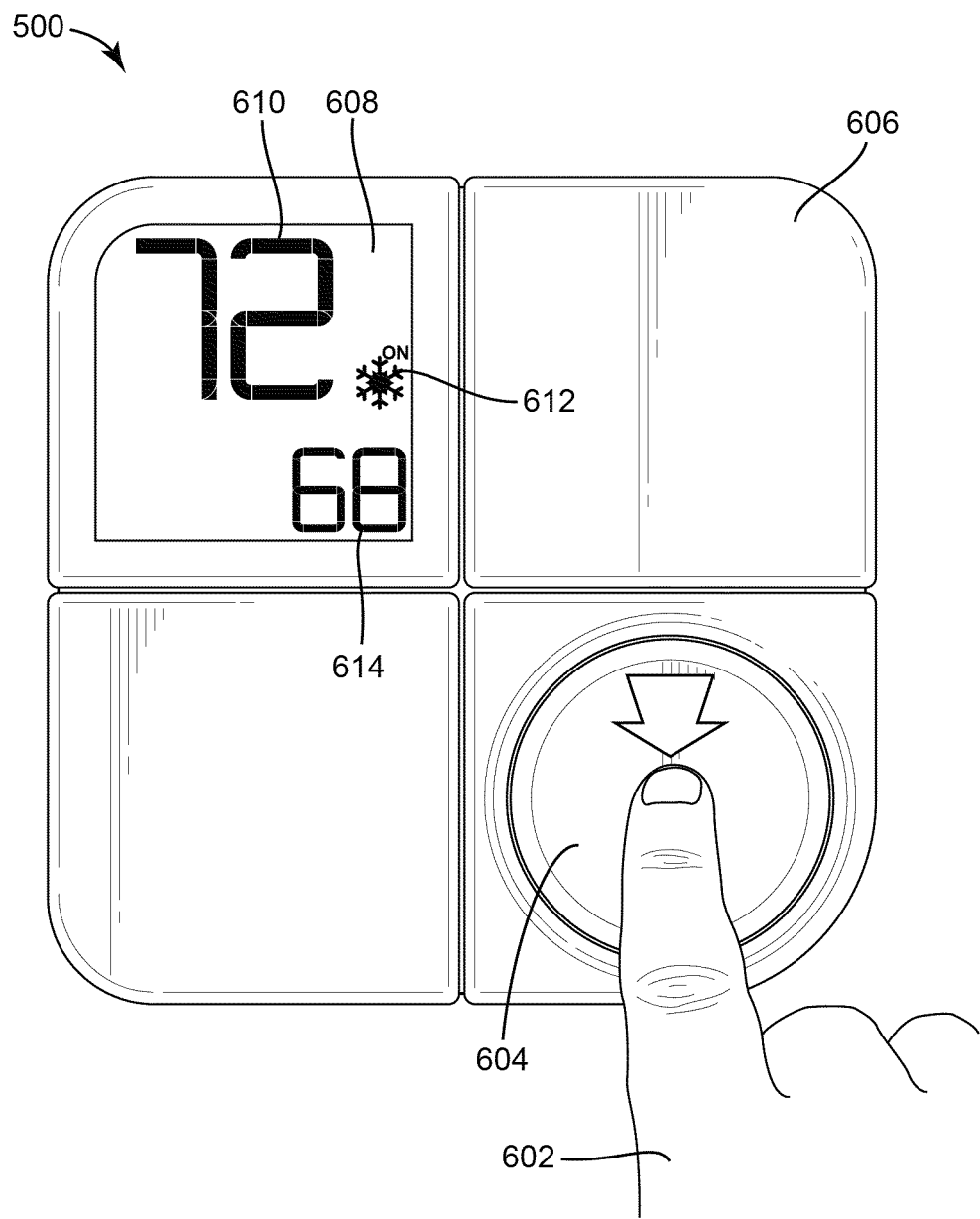
FIG. 12 is a perspective schematic drawing of a user interacting with a thermostat to determine a mode of operation for a residential heating and cooling system, which can be used in the system of FIGS. 3-4, according to some embodiments.

In some embodiments, dial 604 is configured to allow only one input to be provided to thermostat 500 at a time. For example, thermostat 500 may include various processing inside of housing 606 that allows for determining control signals provided to various building equipment. When user 602 provides two inputs in a short period of time (e.g., 200 ms, 500 ms, etc.) by both rotating dial 604 (as shown in FIG. 6) and pushing dial 604 (as shown in FIG. 12), thermostat 500 may only operate processing based on the first input provided. In various embodiments, user 602 may accidentally rotate dial 604 when pressing dial 604. To reduce operator error, thermostat 500 may only operate based on the first received input when two inputs are received in a short period of time.

Display 608 can be any type of display capable of providing information to a user (e.g., user 602). Display 608 can be a touchscreen or other type of electronic display configured to present information to a user in a visual format (e.g., as text, graphics, etc.) and receive input from a user (e.g., via a touch-sensitive panel). In some embodiments, any display of numbers, letters, icons, or images on display 608 may be larger than typical display elements for a thermostat. In some embodiments, icons are made larger on display 608 to allow users that are visually impaired (e.g., elderly residents) to operate thermostat 500 with greater ease.

Figure 7:
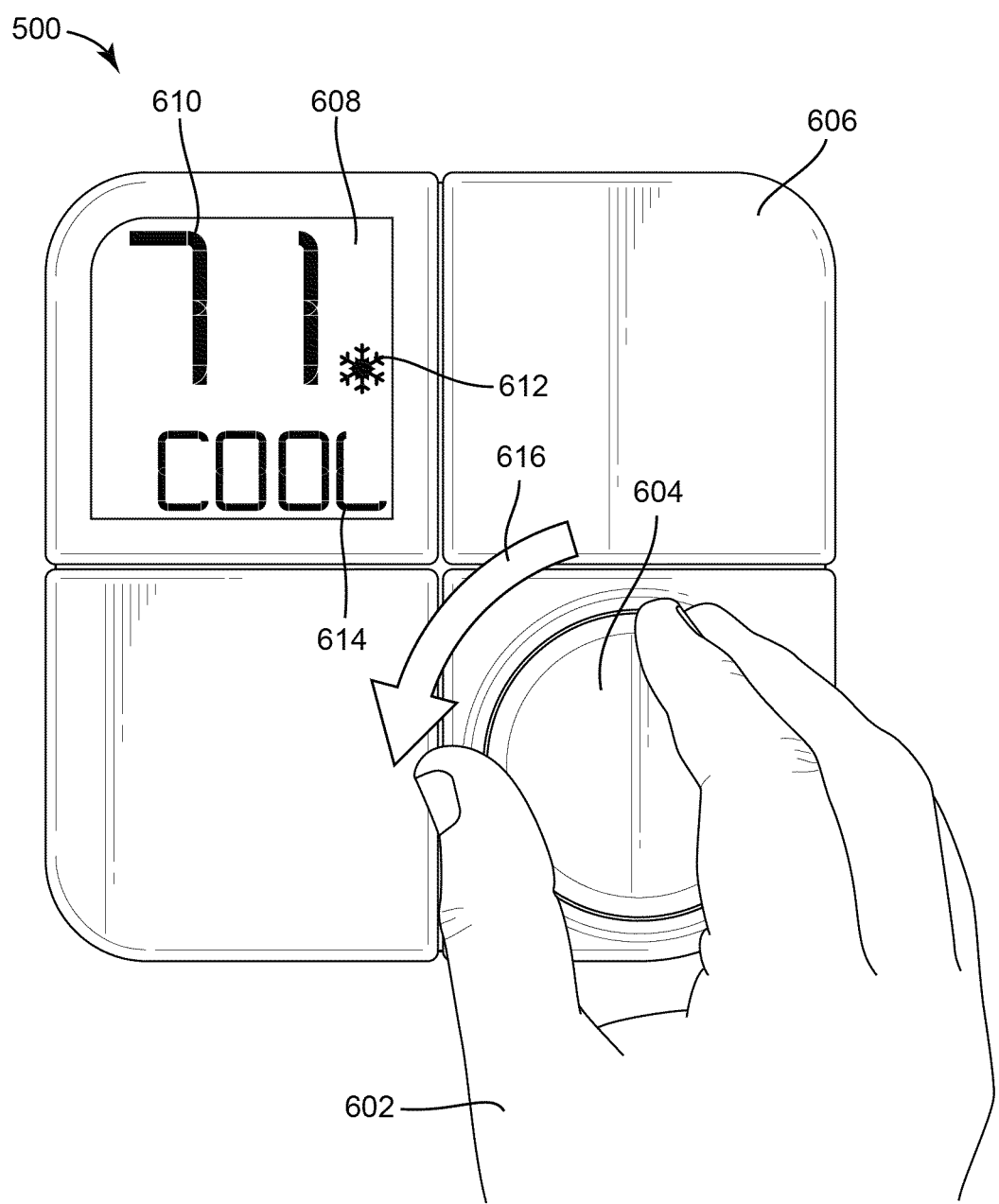
FIG. 7 is a perspective schematic drawing of a of a user interacting with a thermostat to provide a temperature setpoint for a residential heating and cooling system, which can be used in the system of FIGS. 3-4, according to some embodiments.
Figure 8:
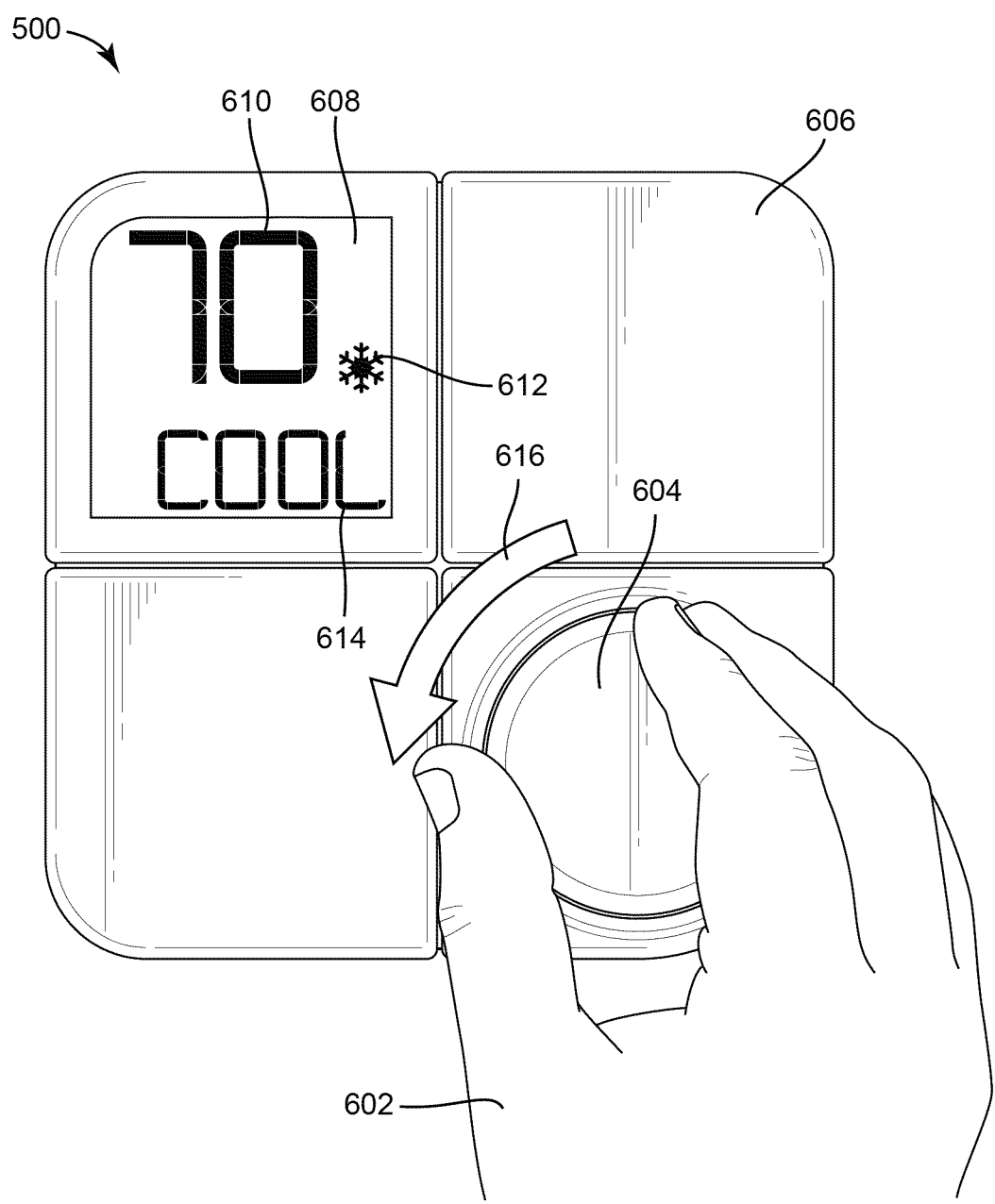
FIG. 8 is a perspective schematic drawing of a user interacting with a thermostat to provide a temperature setpoint for a residential heating and cooling system, which can be used in the system of FIGS. 3-4, according to some embodiments.
Figure 9:
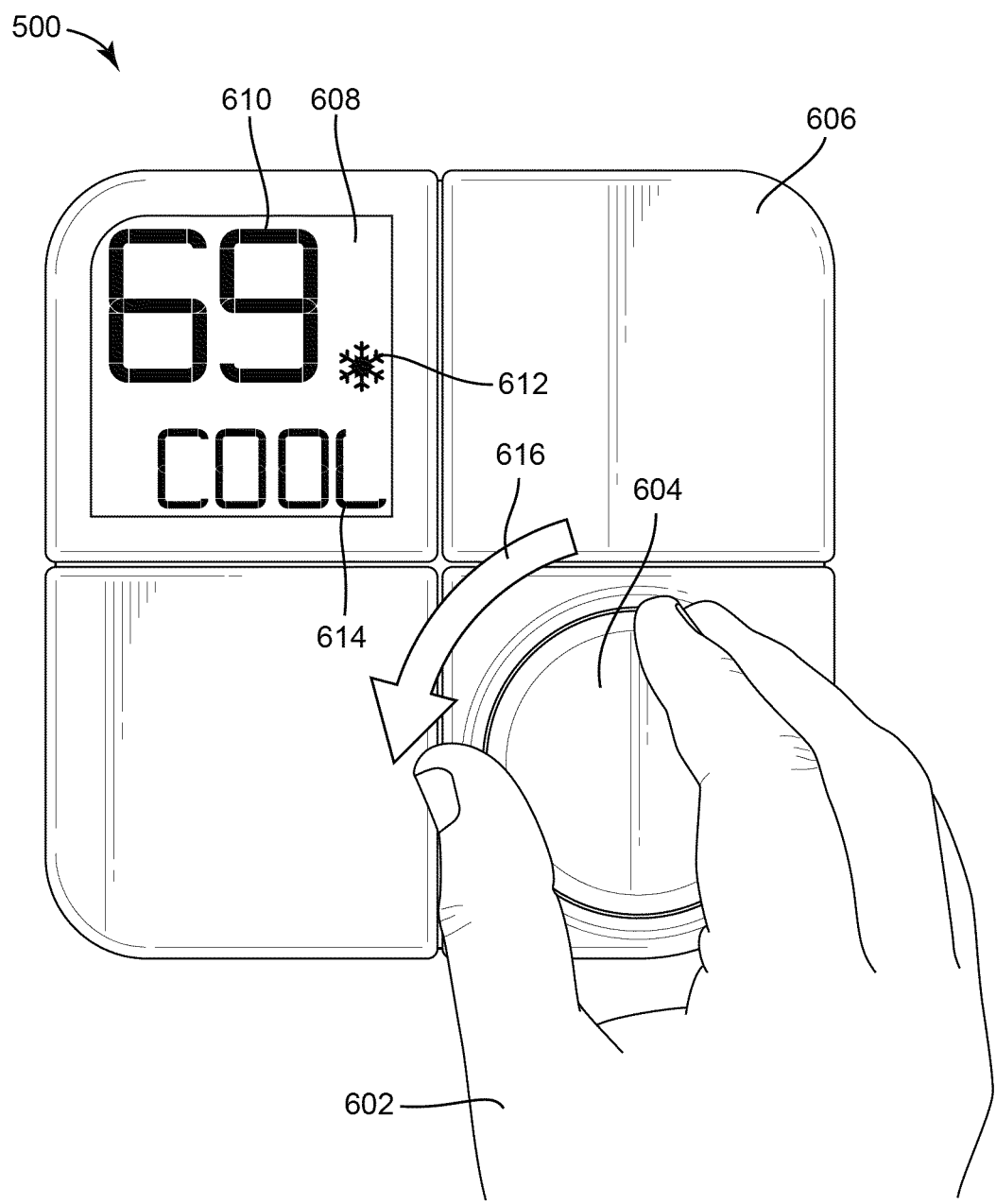
FIG. 9 is a perspective schematic drawing of a user interacting with a thermostat to provide a temperature setpoint for a residential heating and cooling system, which can be used in the system of FIGS. 3-4, according to some embodiments.
Figure 10:
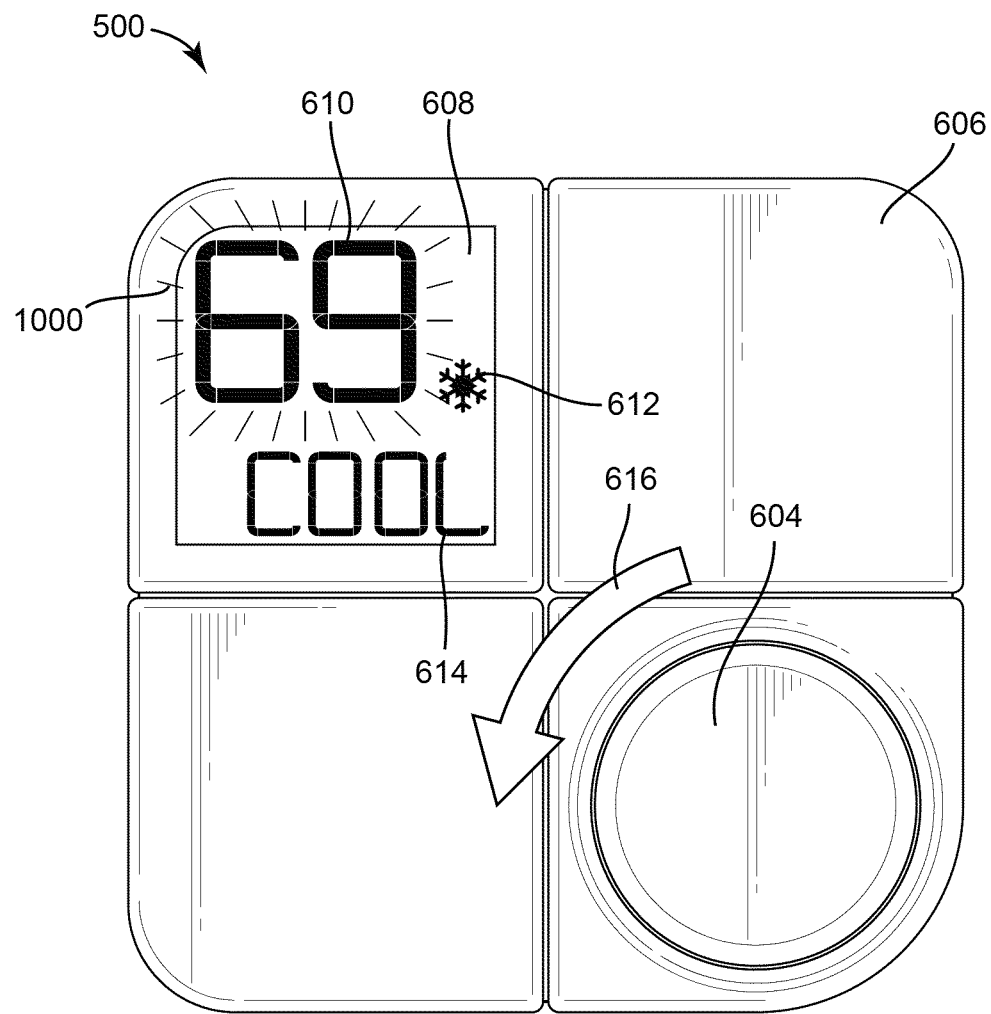
FIG. 10 is a perspective schematic drawing of a thermostat for a residential heating and cooling system, which can be used in the system of FIGS. 3-4, according to some embodiments.
Figure 11:
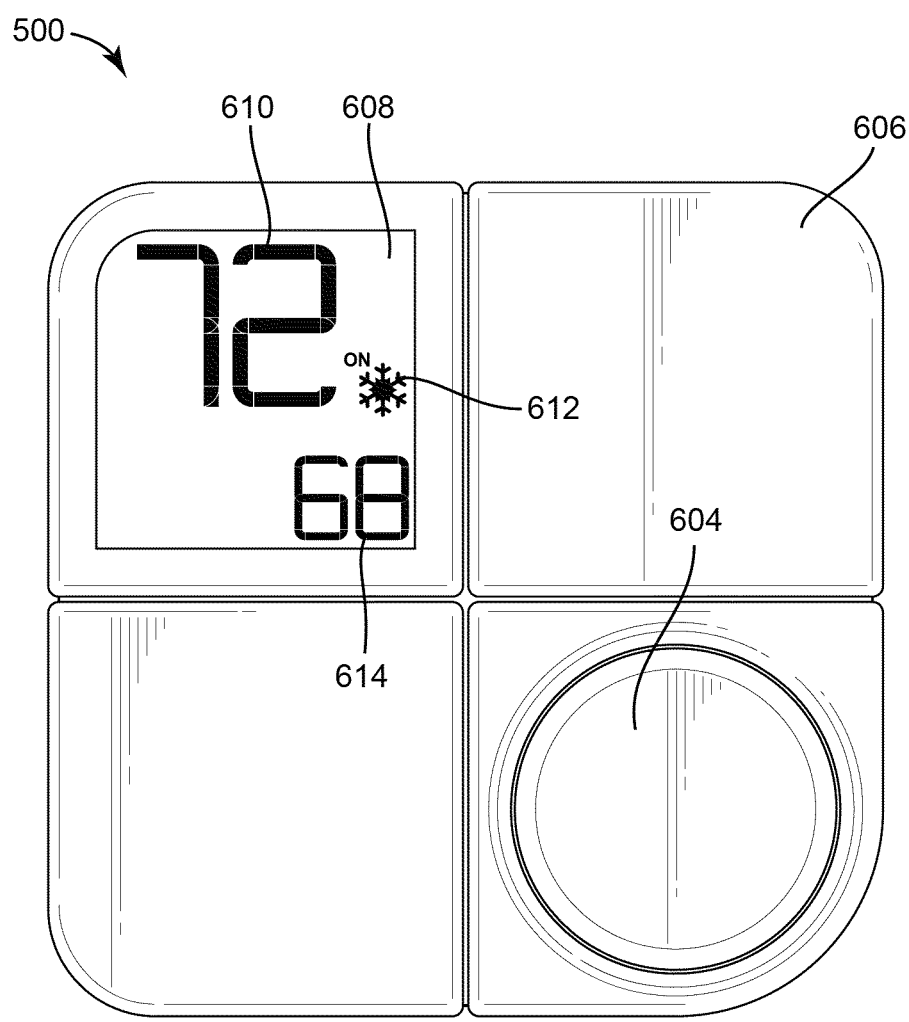
FIG. 11 is a perspective schematic drawing of a thermostat for a residential heating and cooling system, which can be used in the system of FIGS. 3-4, according to some embodiments.

In some embodiments, user 602 rotates dial 604 to scroll through different values for the temperature setpoint 614. For example, user 602 rotates dial 604 counter-clockwise to find a temperature setpoint that will lower the temperature of the building zone. Indicator 612 displays a snowflake icon, indicating that the thermostat 500 is providing control signals for cooling when the user scrolls through a temperature setpoint 614 that is lower than temperature 610. For example, FIGS. 6-8 show user 602 rotating dial 604 to reduce the temperature inside of the building zone. The user 602 scrolls through various desired temperatures 610 and reaches a desired temperature 610 (i.e., 68 degrees), as shown in FIG. 10. When the desired temperature is chosen, a setpoint indicator 1000 appears on display 608 to indicate the temperature setpoint 614 has been chosen. In some embodiments, a desired temperature is chosen based on user 602 waiting a period of time that is substantially longer than the time it takes to scroll through various temperatures. For example, user 602 scrolls through different values for the temperature setpoint 614 at a rate of 1 temperature per second. Once the desired temperature is reached, a pause of 5 seconds is required to indicate that the temperature scrolled to on display 608 is the chosen temperature. Referring now to FIG. 11, temperature setpoint 614 displays the temperature chosen by user 602. Additionally, indicator 612 displays an "ON" message proximate the snowflake icon to indicate that the thermostat is providing control signals to HVAC equipment that will induce cooling.

Figure 13:
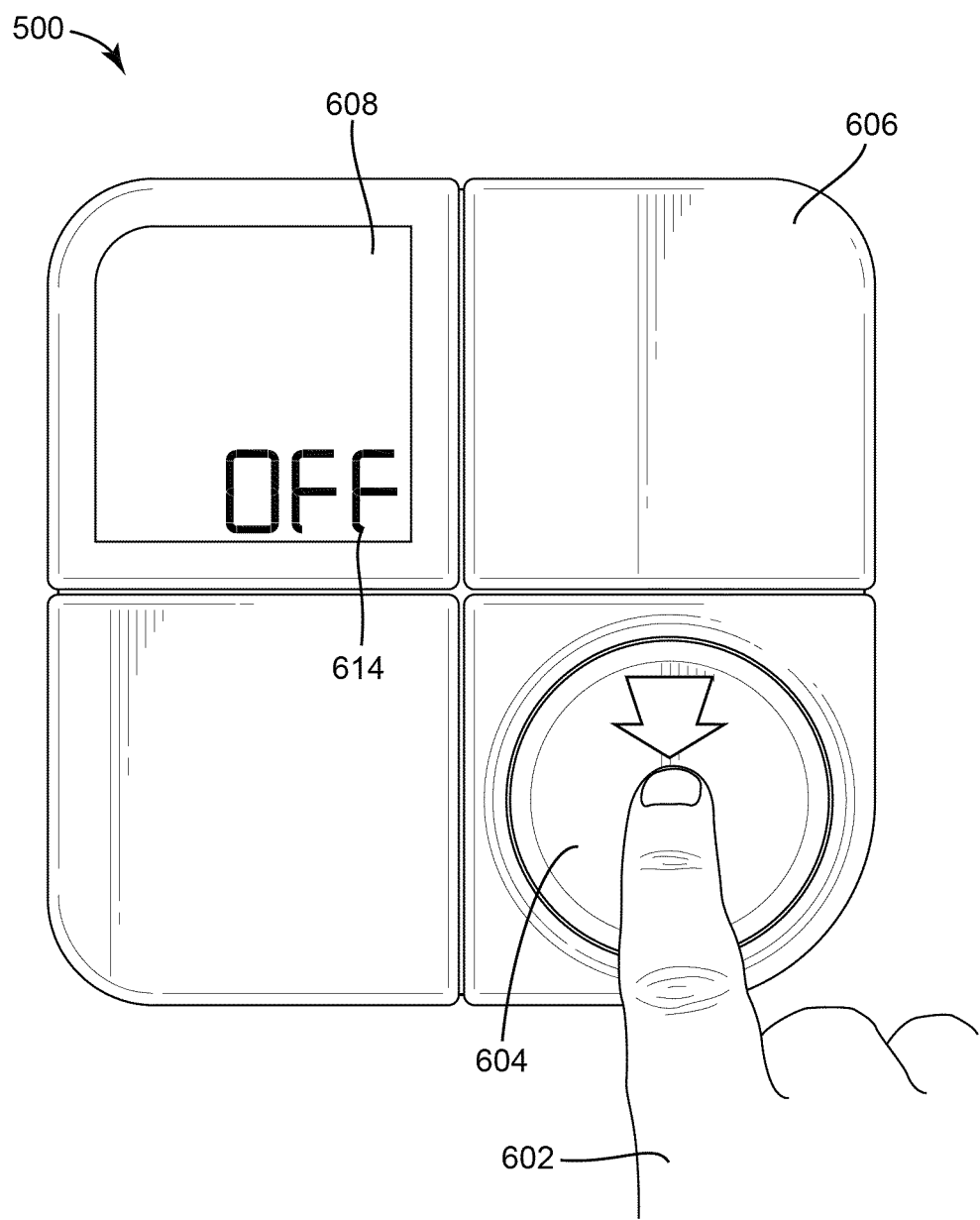
FIG. 13 is a perspective schematic drawing of a user interacting with a thermostat to determine a mode of operation for a residential heating and cooling system, which can be used in the system of FIGS. 3-4, according to some embodiments.
Figure 14:
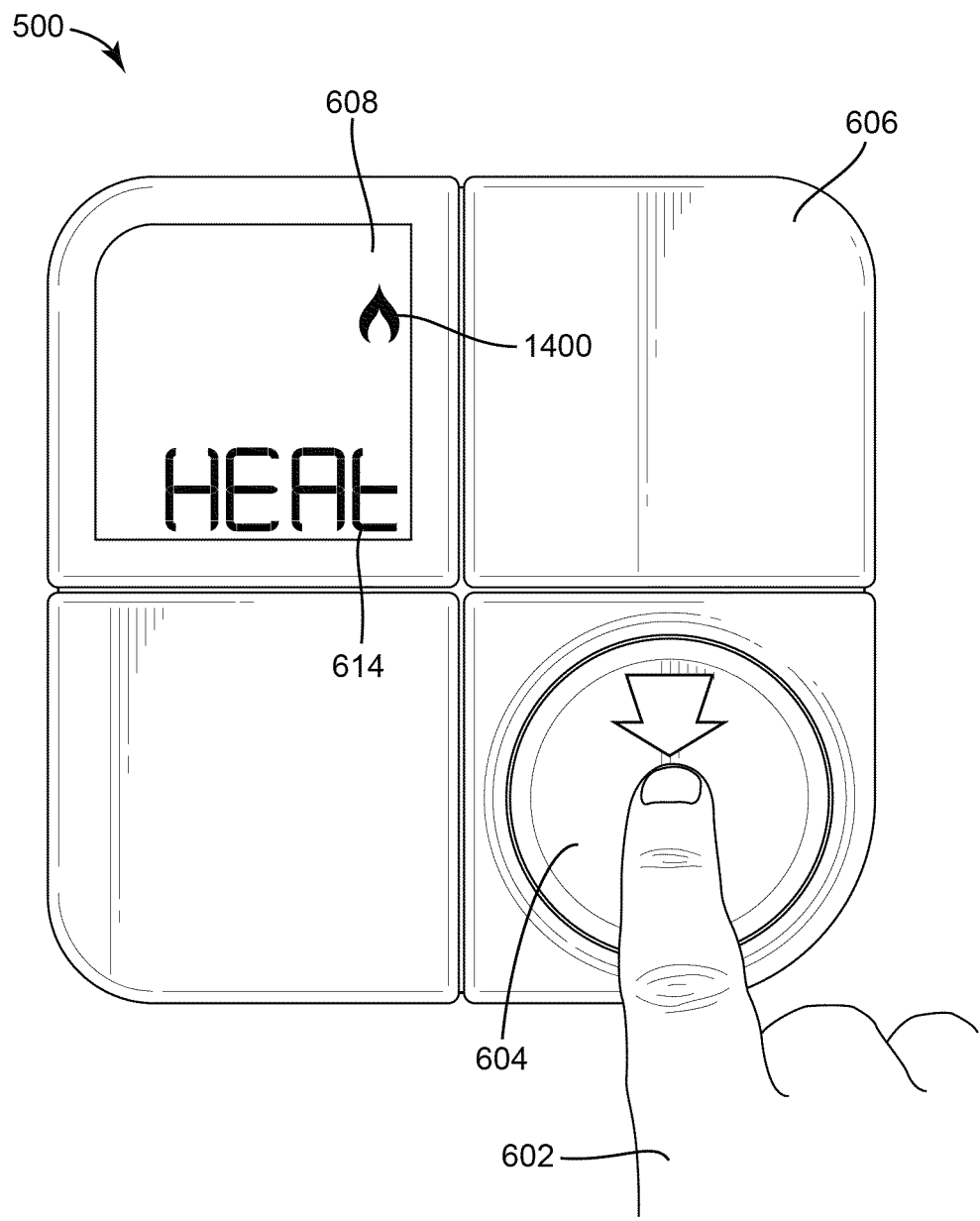
FIG. 14 is a perspective schematic drawing of a user interacting with a thermostat to determine a mode of operation for a residential heating and cooling system, which can be used in the system of FIGS. 3-4, according to some embodiments.
Figure 15:
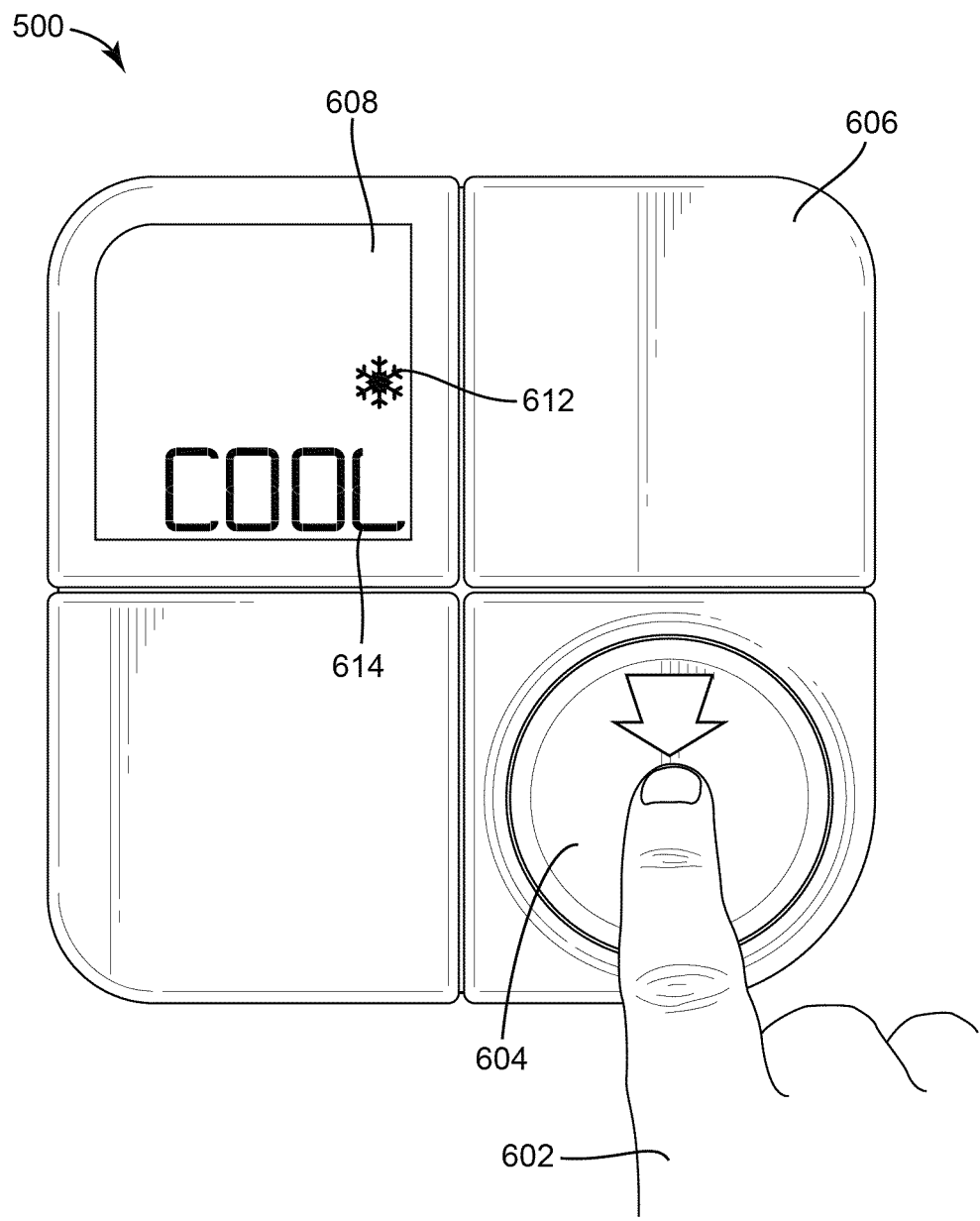
FIG. 15 is a perspective schematic drawing of a user interacting with a thermostat to determine a mode of operation for a residential heating and cooling system, which can be used in the system of FIGS. 3-4, according to some embodiments.
Figure 16:
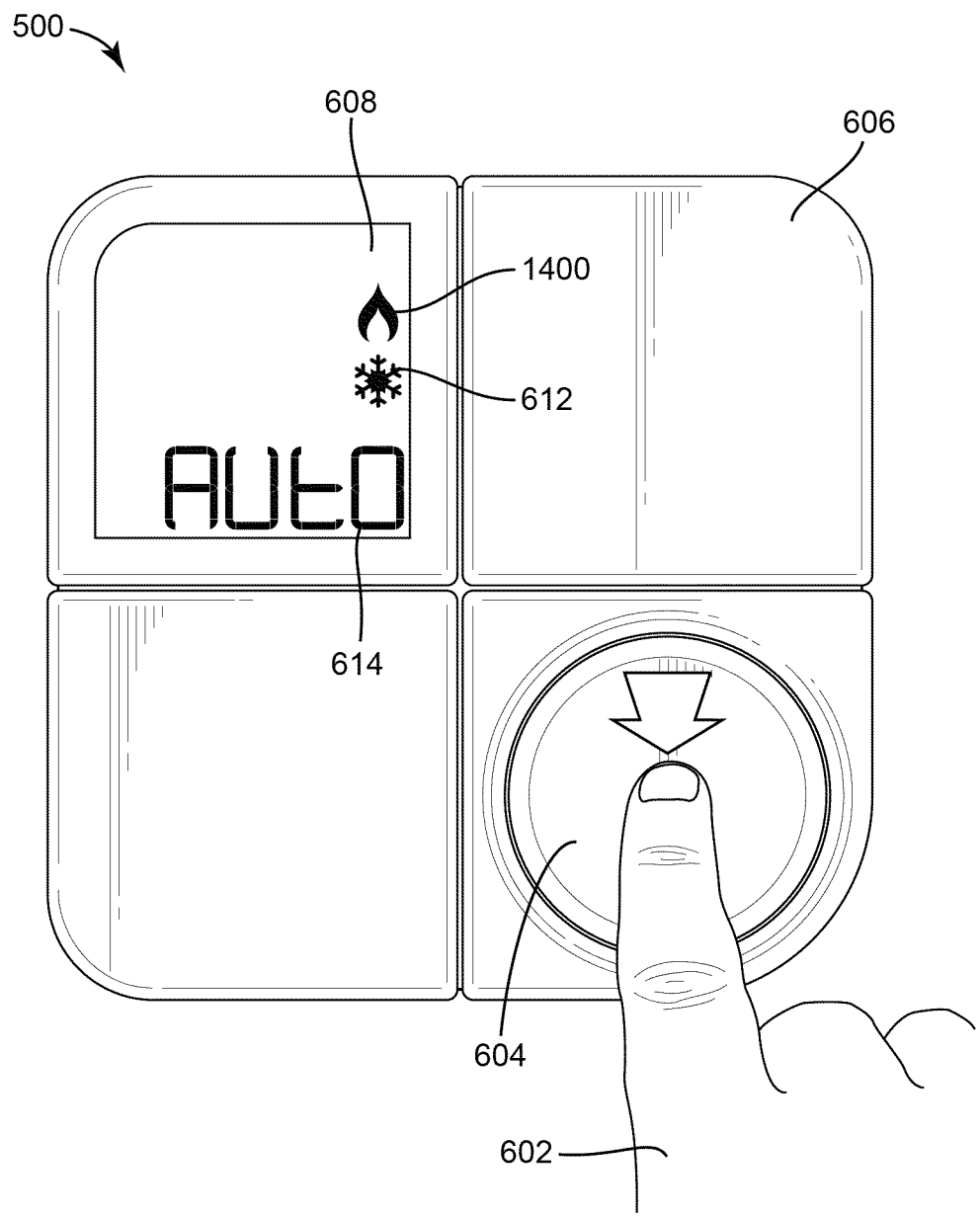
FIG. 16 is a perspective schematic drawing of a user interacting with a thermostat to determine a mode of operation for a residential heating and cooling system, which can be used in the system of FIGS. 3-4, according to some embodiments.
Figure 17:
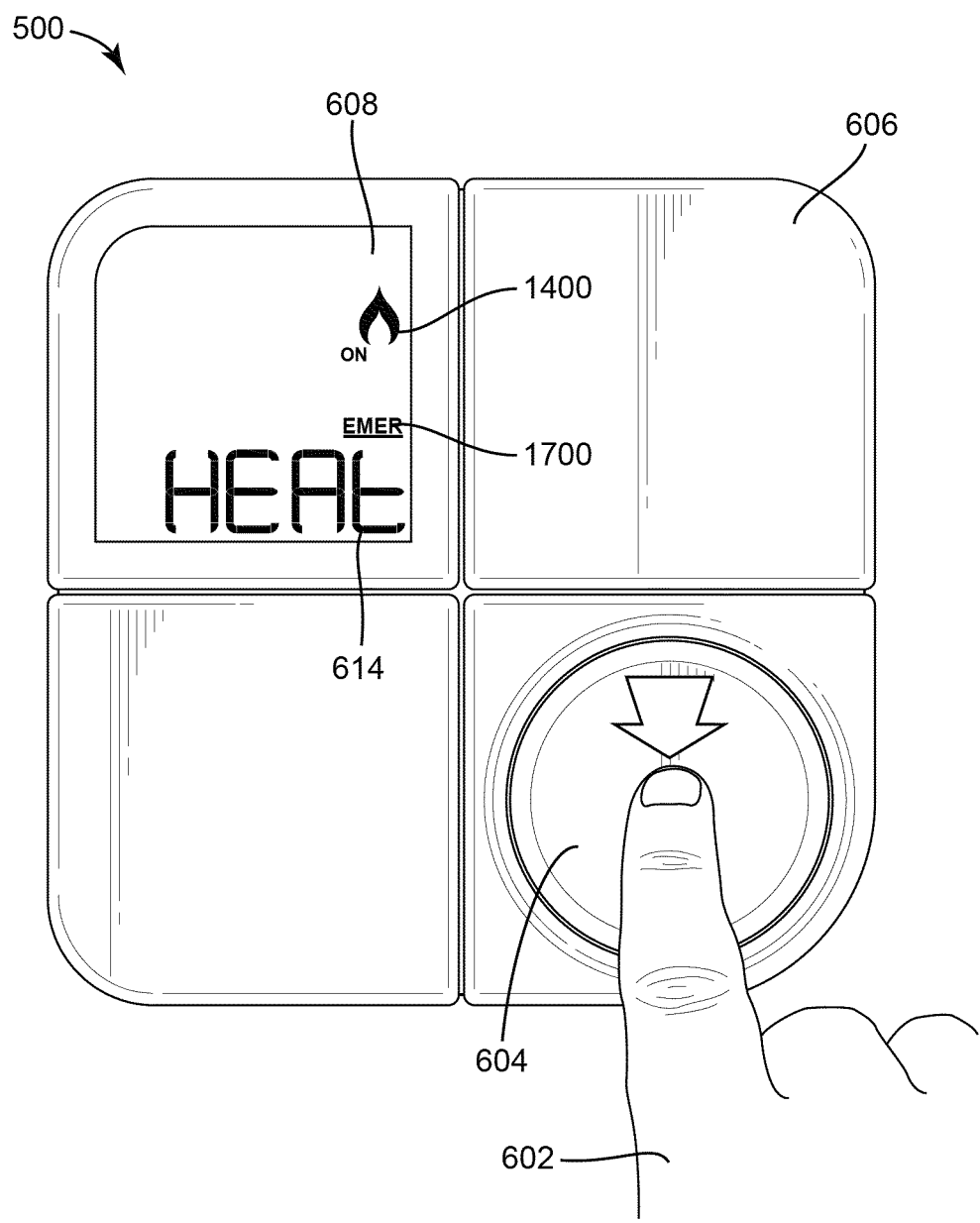
FIG. 17 is a perspective schematic drawing of a user interacting with a thermostat to determine a mode of operation for a residential heating and cooling system, which can be used in the system of FIGS. 3-4, according to some embodiments.
Figure 18:
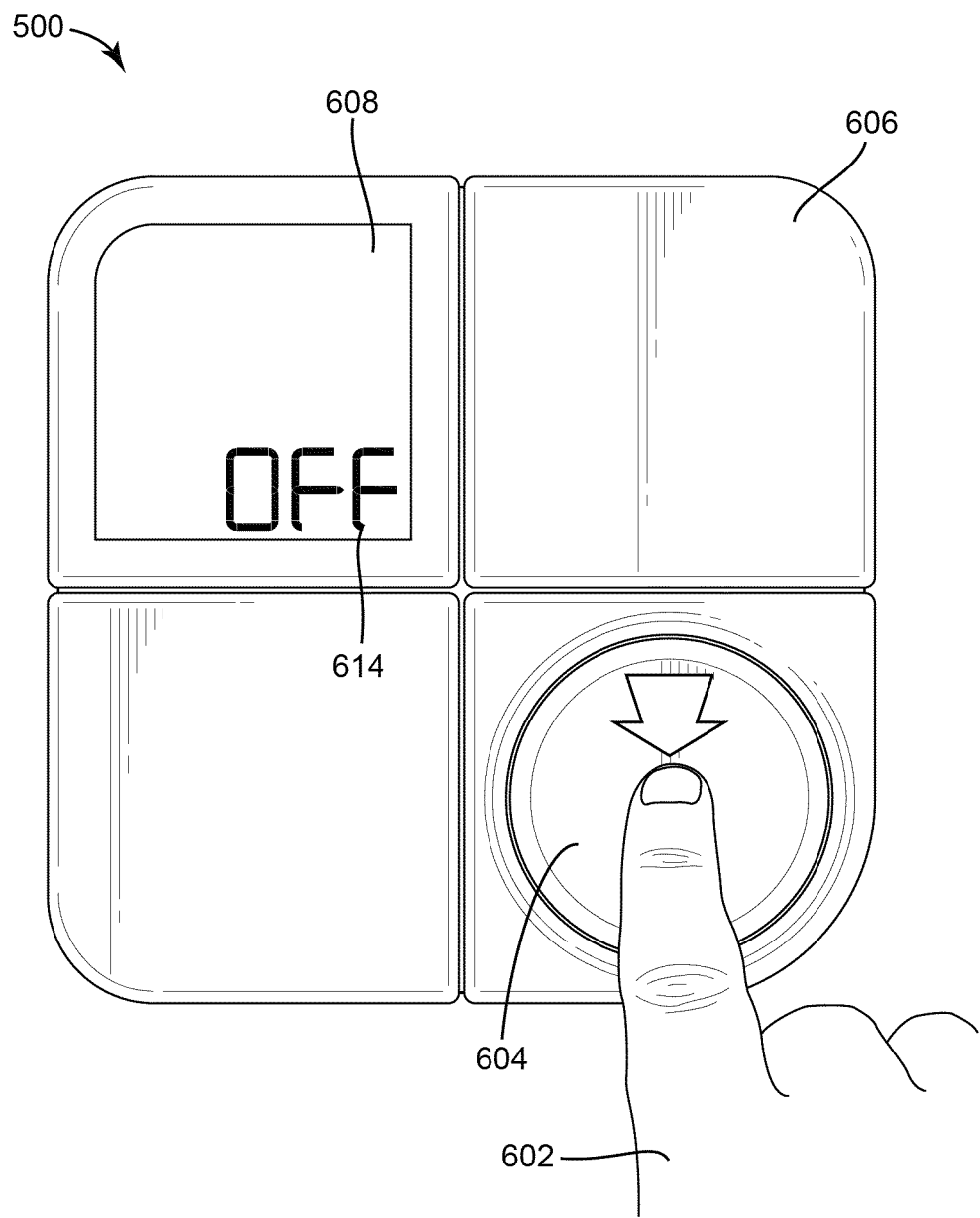
FIG. 18 is a perspective schematic drawing of a user interacting with a thermostat to determine a mode of operation for a residential heating and cooling system, which can be used in the system of FIGS. 3-4, according to some embodiments.

Referring now to FIGS. 12-20, a user selects an HVAC mode on thermostat 500, according to some embodiments. In FIG. 12, user 602 pushes dial 604 to change an HVAC mode. An HVAC mode may include heating, cooling, air conditioning, or any combination thereof to change the temperature of a building zone. In FIG. 12, user 602 pushes dial 604 to change HVAC mode from cooling, as indicated by indicator 612, to a different mode. User 602 pushes dial 604 to transition through the various modes of thermostat 500. In FIG. 13, user 602 presses dial 604 to scroll to "OFF" mode. In some embodiments, the "OFF" mode turns off thermostat 500. In FIG. 14, user 602 presses dial 604 to scroll to "HEAT" mode, as indicated by indicator 1400 showing a flame symbol. In some embodiments, the "HEAT" mode allows thermostat 500 to provide control signals to HVAC equipment that allow for heating in a building zone. In FIG. 16, user 602 presses dial 604 to scroll to "AUTO" mode. "AUTO" mode may allow thermostat 500 to adjust the temperature providing control signals that either heat or cool a building zone. This mode may be indicated by display 608 showing both indicators 612, 1400 at the same time. In FIG. 17, user 602 presses dial 604 to scroll to "HEAT" mode. "HEAT" mode may allow thermostat 500 to adjust the temperature providing control signals that heat a building zone. "HEAT" mode may also include indicator 1700. Indicator 1700 is shown to display "EMER" and may be indicative an emergency setting that allows thermostat 500 to monitor for dangerous temperatures. This mode may be indicated by display 608 showing both indicators, 1400, 1700 at the same time.

Figure 19:
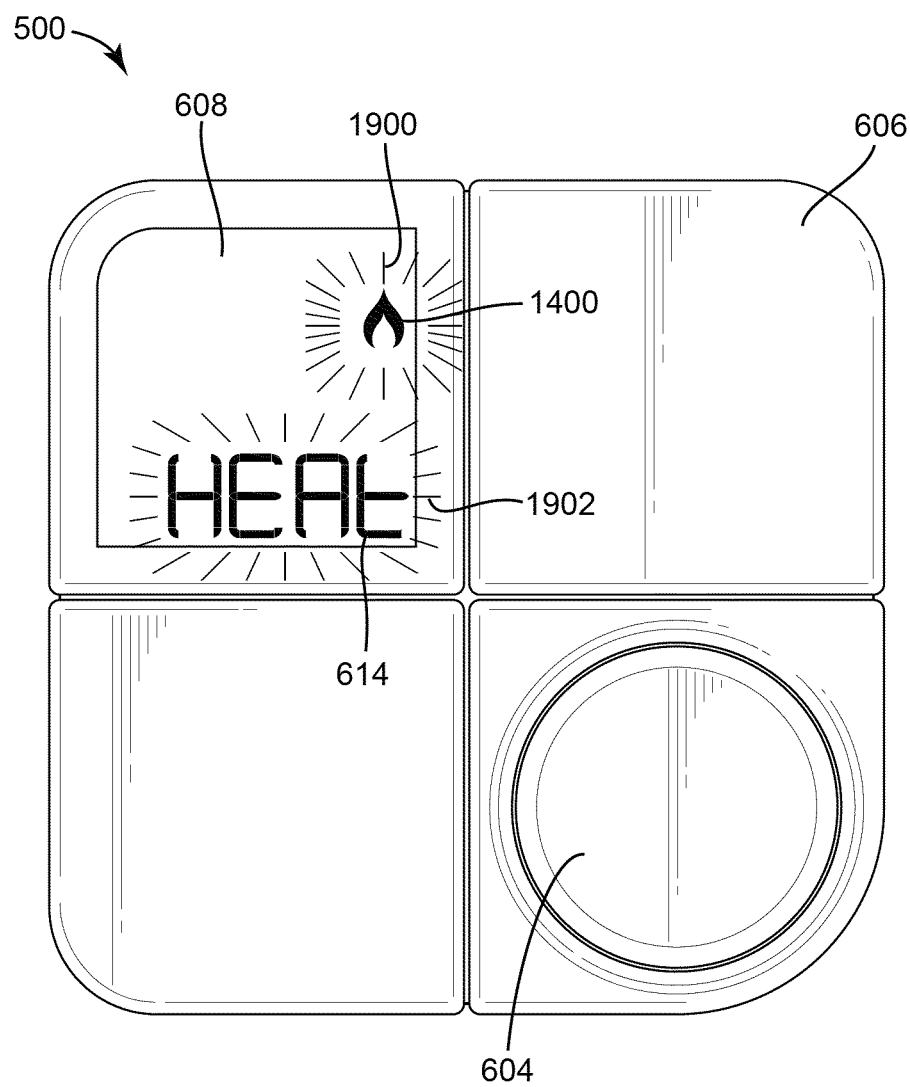
FIG. 19 is a perspective schematic drawing of a thermostat for a residential heating and cooling system, which can be used in the system of FIGS. 3-4, according to some embodiments.

Referring now to FIG. 19, user 602 presses dial 604 to scroll to "HEAT" mode. Once the desired mode is scrolled to by user 602, the user may select the mode as the desired mode. This may be done by waiting a predetermined period of time, as described above. Once the desired mode is chosen, mode indicator 1902 may be displayed on display 608. Additionally, a second mode indicator 1900 may be displayed on display 608. Mode indicators 1900, 1902 may flash, light-up, or blink to indicate that the user has selected an HVAC mode.

Figure 20:
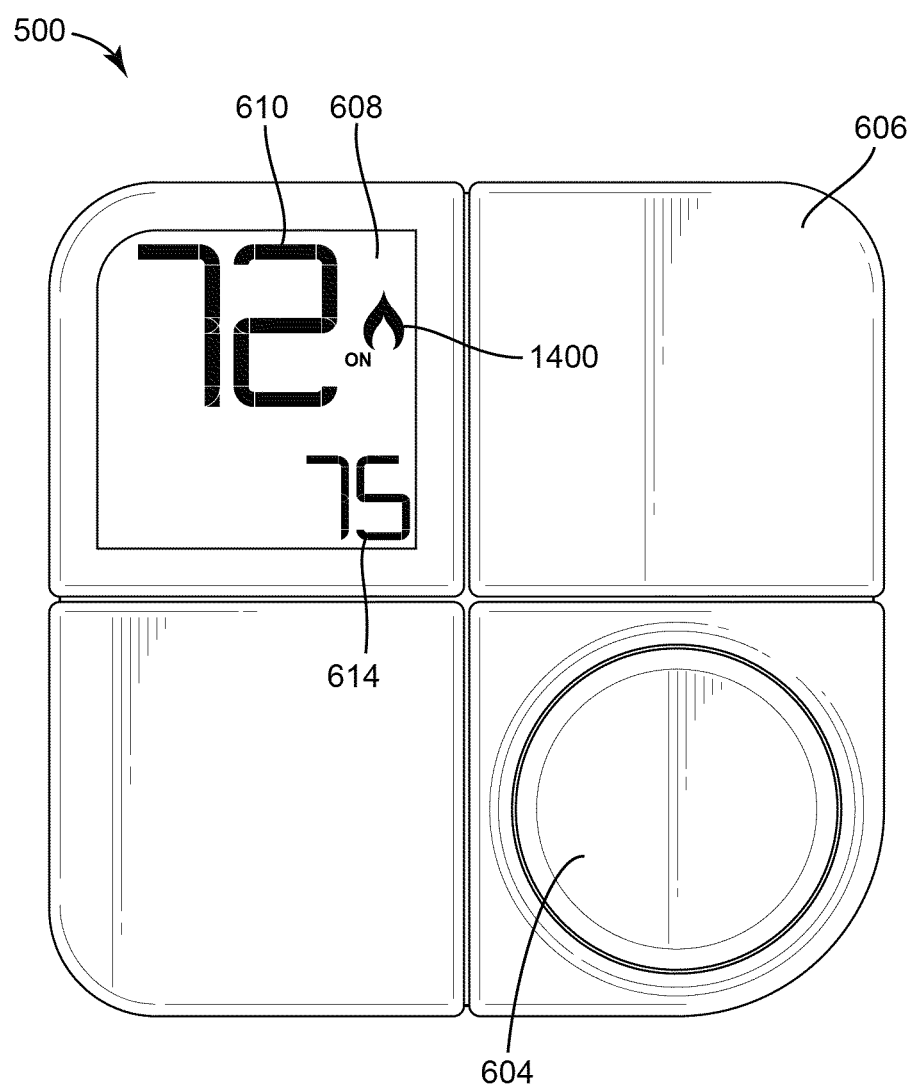
FIG. 20 is a perspective schematic drawing of a thermostat for a residential heating and cooling system, which can be used in the system of FIGS. 3-4, according to some embodiments.

Referring now to FIG. 20, indicator 1400 shows a flame symbol to indicate that the HVAC mode has been set to "HEAT," per the user's selection. Temperature setpoint 614 displays "75 degrees" while temperature display 610 shows "72 degrees." Thermostat 500 may then provide heating control signals that will increase the temperature 610 to temperature setpoint 614.

Figure 21:
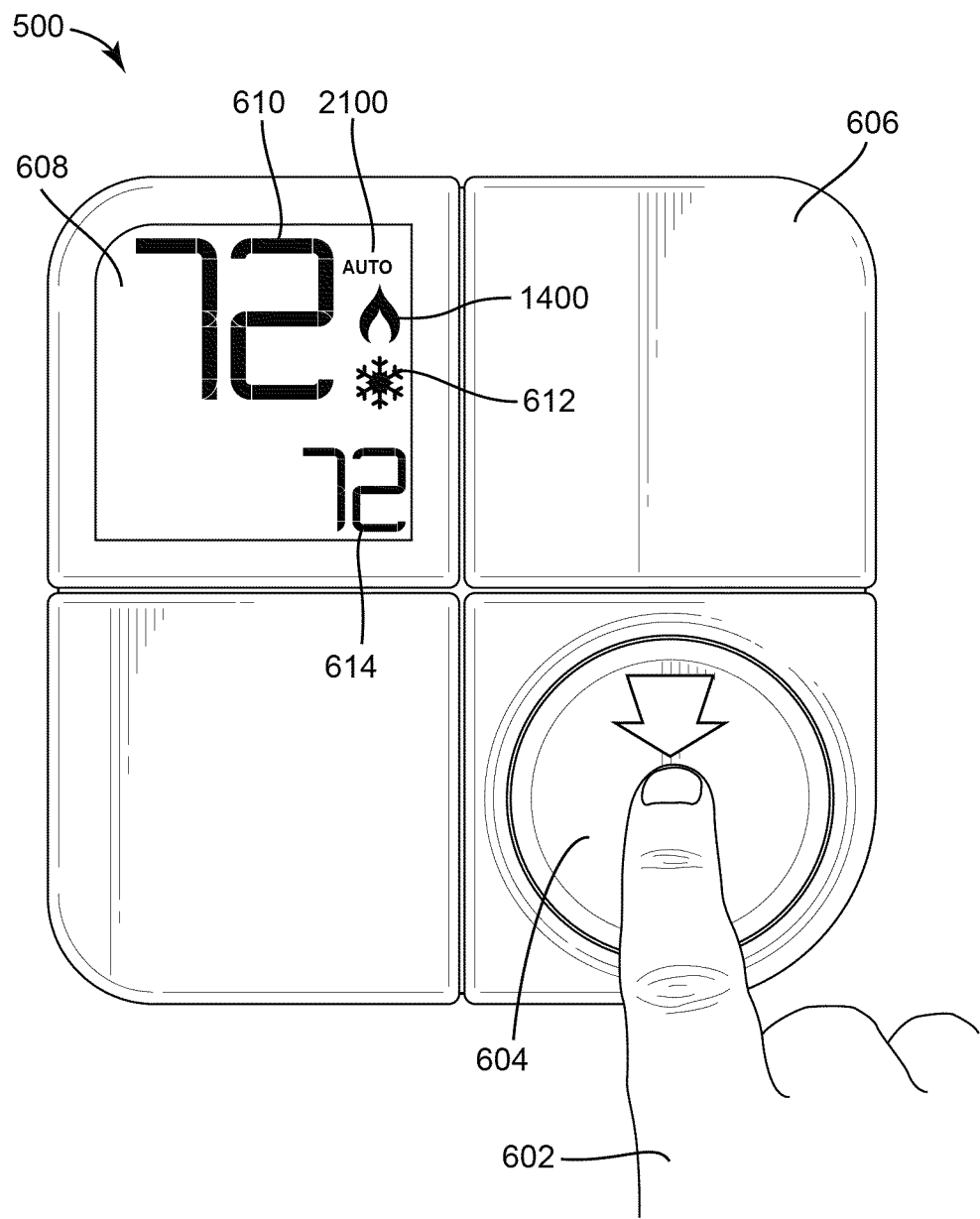
FIG. 21 is a perspective schematic drawing of a user interacting with a thermostat for a residential heating and cooling system, which can be used in the system of FIGS. 3-4, according to some embodiments.
Figure 22:
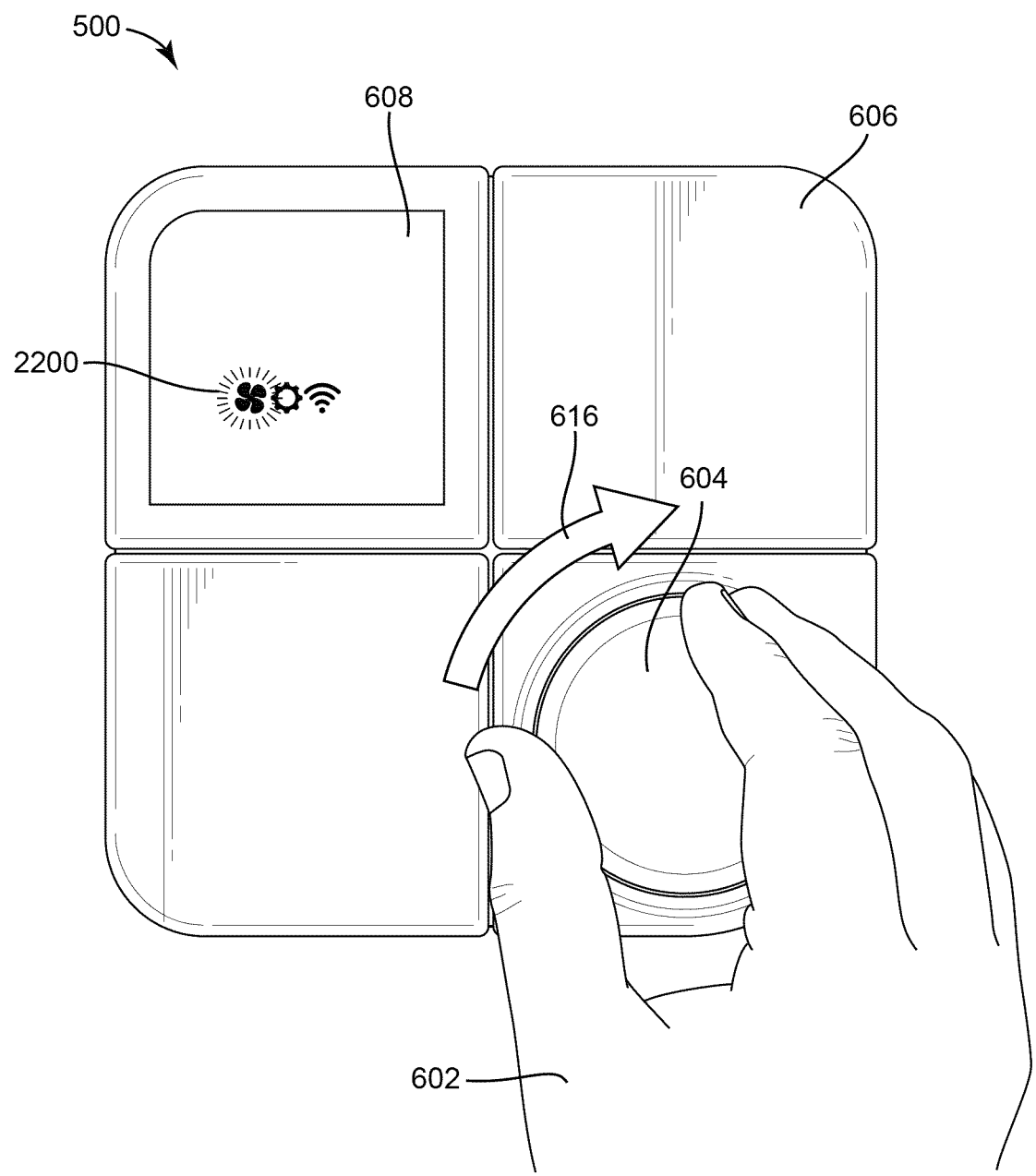
FIG. 22 is a perspective schematic drawing of a user interacting with a thermostat for a residential heating and cooling system, which can be used in the system of FIGS. 3-4, according to some embodiments.

Referring now to FIGS. 21-26, a drawing of a user navigating a menu selection on thermostat 500 is shown, according to some embodiments. In FIG. 21, user 602 presses and holds dial 604 for a predetermined time (e.g., 1 second, 3 seconds, 5 seconds, etc.) to access a primary menu. Thermostat 500 is currently in an "AUTO" mode, as indicated by indicators 612, 1400, and 2100 as shown on display 608. Once a user accesses the primary menu, the user 602 may be prompted to select a variety of features of thermostat 500. This is shown in FIG. 22. In FIG. 22, user 602 rotates dial 604 after accessing the primary menu to scroll through features of thermostat 500. In some embodiments, when user 602 pushes dial 604, user 602 is brought directly to a menu rather than a screen to select among various other menus. For example, user 602 is brought directly to a menu for different features, rather than a menu to select from various other menus (e.g., "settings" menu, "device information" menu, etc.).

Figure 23:
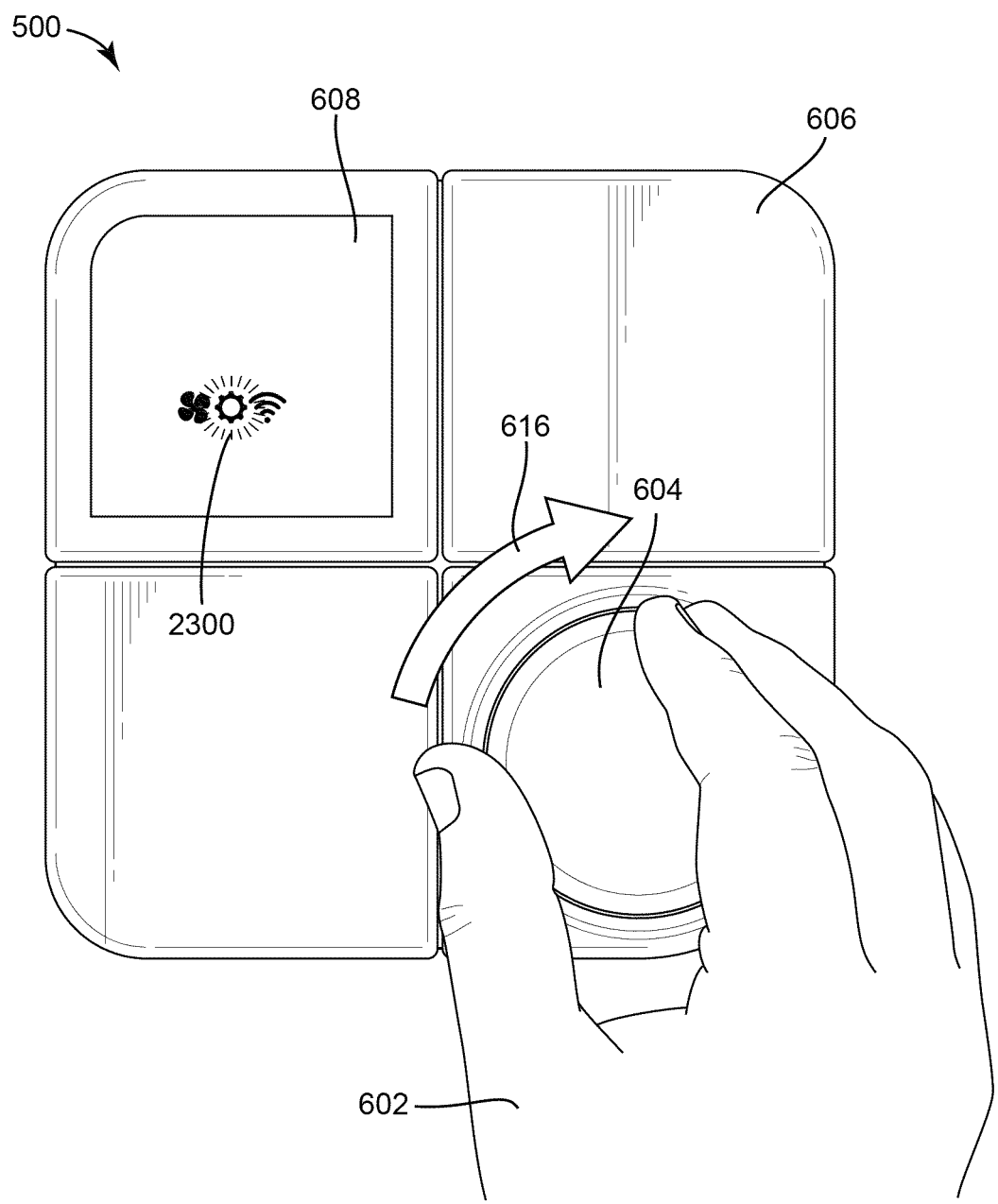
FIG. 23 is a perspective schematic drawing of a user interacting with a thermostat for a residential heating and cooling system, which can be used in the system of FIGS. 3-4, according to some embodiments.
Figure 24:
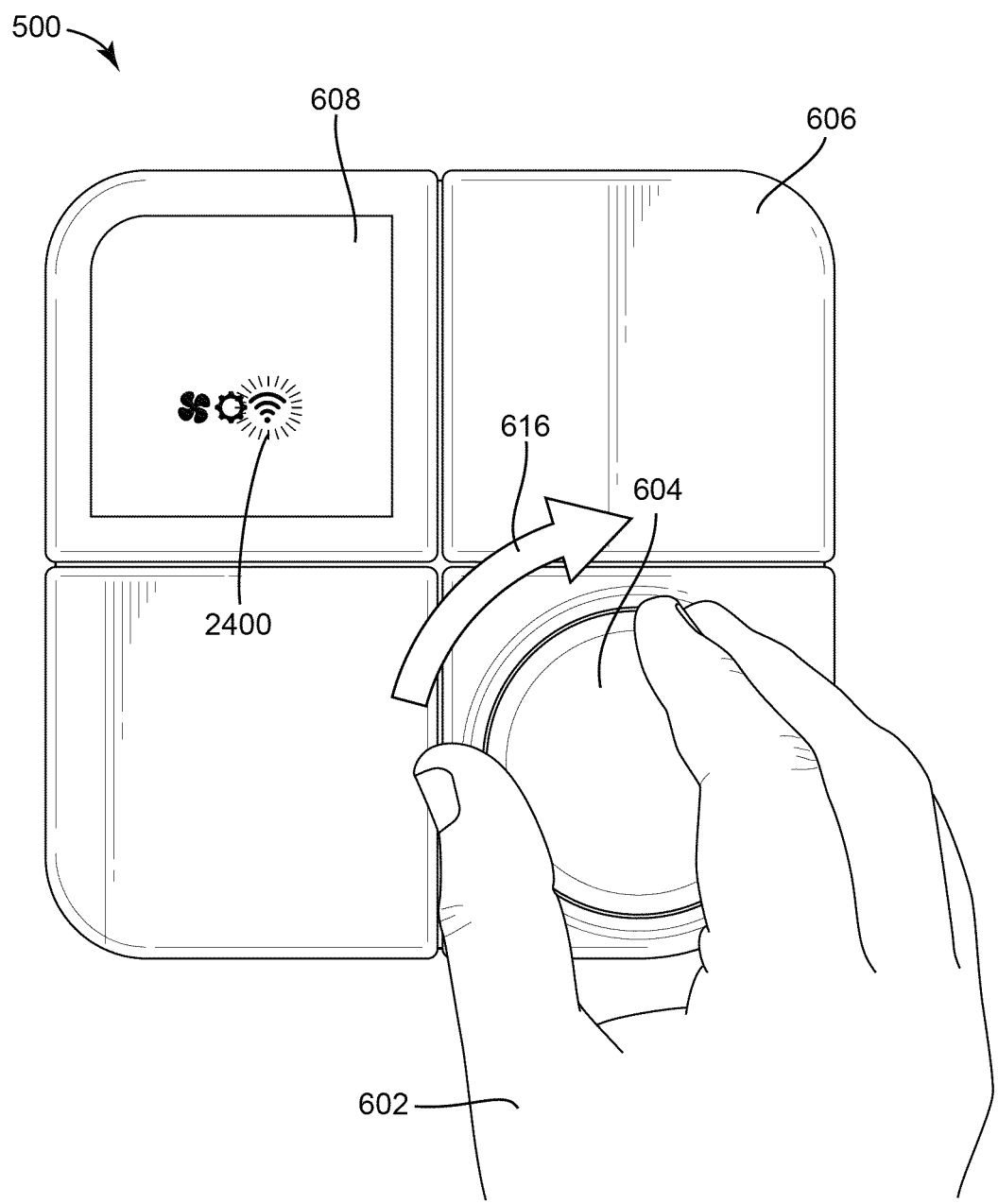
FIG. 24 is a perspective schematic drawing of a user interacting with a thermostat for a residential heating and cooling system, which can be used in the system of FIGS. 3-4, according to some embodiments.
Figure 25:
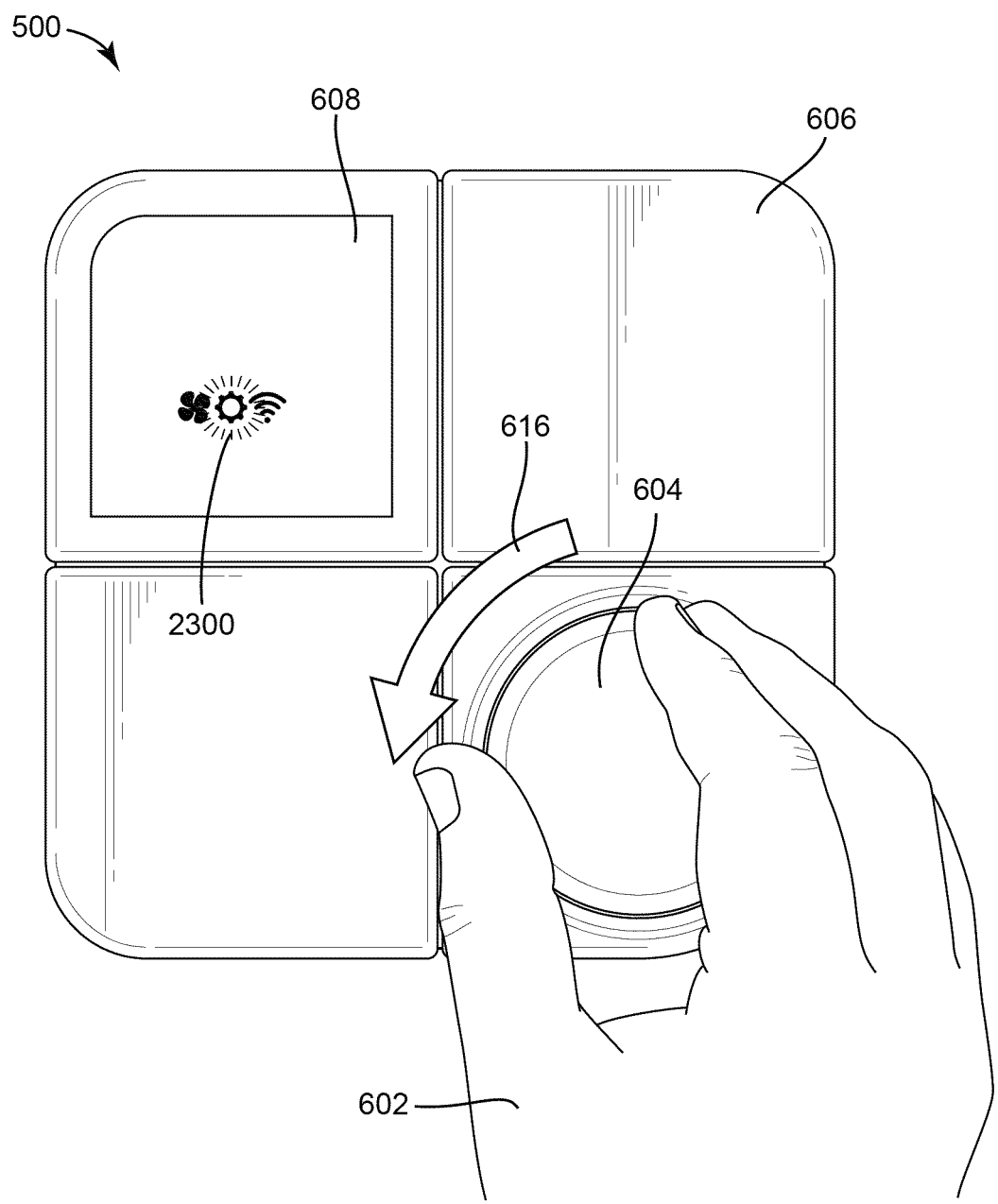
FIG. 25 is a perspective schematic drawing of a user interacting with a thermostat for a residential heating and cooling system, which can be used in the system of FIGS. 3-4, according to some embodiments.

Referring now to FIG. 22, a user selects fan feature 2200. The feature selected may be indicated by a flash, light-up, or blinking light on display 608 as described above. Fan feature 2200 may represent a feature that enables, disables, or alters operation of a fan within control system 4200. In FIG. 23, a user selects settings feature 2300. Settings feature 2300 may represent a feature that changes various settings regarding operation of thermostat 500. For example, settings feature 2300 may allow a user to place temperature boundaries (e.g., no lower than 62 degrees) on the temperature setpoints of thermostat 500, to provide a safe environments for infants and other vulnerable residents. In FIG. 24, a user selects connectivity feature 2400. Connectivity feature 2400 may represent a feature that changes various settings regarding the connectivity of thermostat 500. For example, connectivity feature 2400 may allow a user to connect wireless devices to thermostat 500 via a Wi-Fi or other wireless networking technology.

Figure 26:
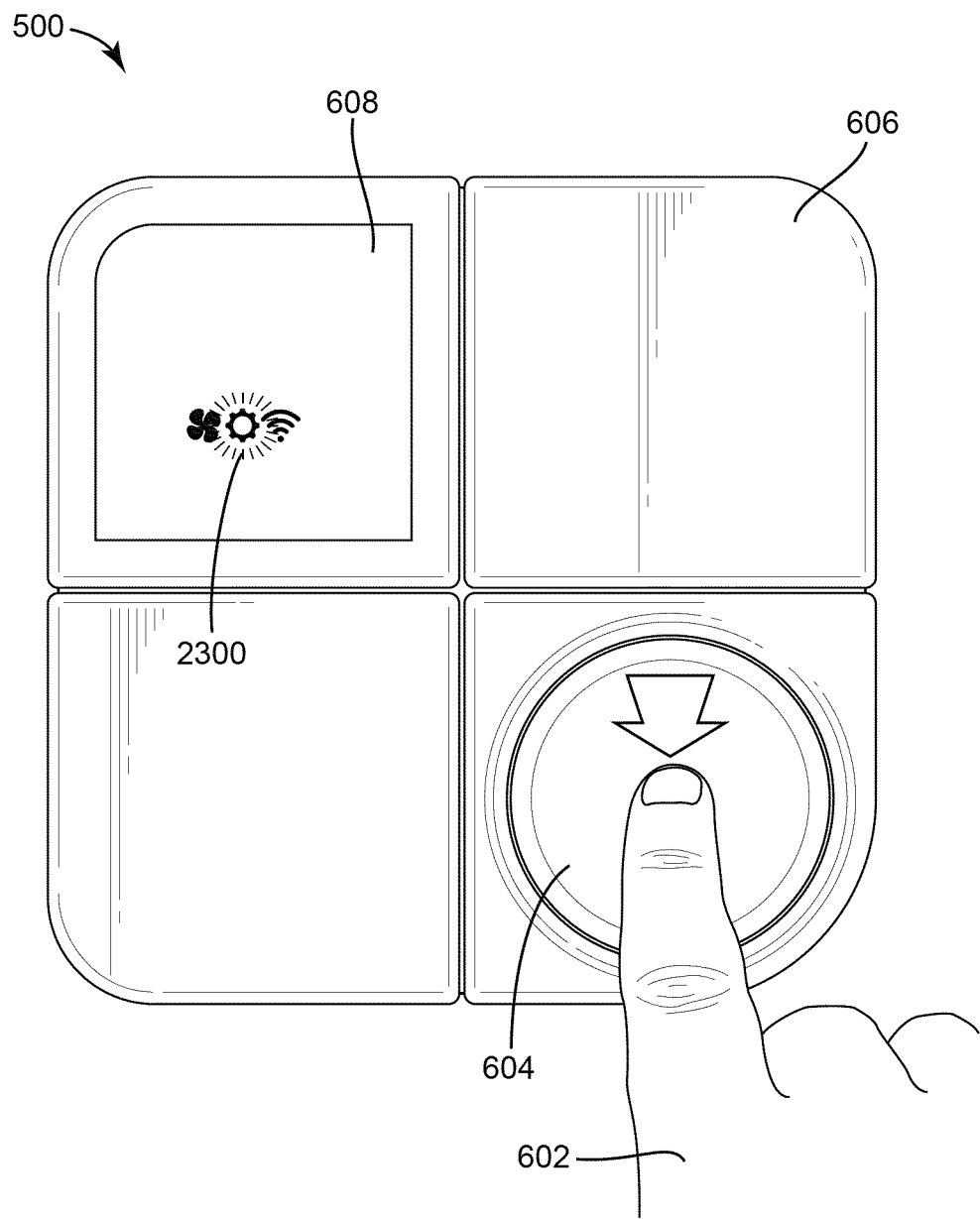
FIG. 26 is a perspective schematic drawing of a user interacting with a thermostat for a residential heating and cooling system, which can be used in the system of FIGS. 3-4, according to some embodiments.

Referring now to FIG. 26, user 602 selects a feature from a primary menu. Once user 602 has accessed the primary menu and scrolled through various features to arrive at a desired feature, user 602 may push dial 604 to choose (e.g., engage selection of) that feature. In FIG. 26, user 602 chooses settings feature 2300. Once selected, user 602 may then enter a settings menu (not shown) to select, change, or modify more detailed operations and settings of thermostat 500.

Figure 27:
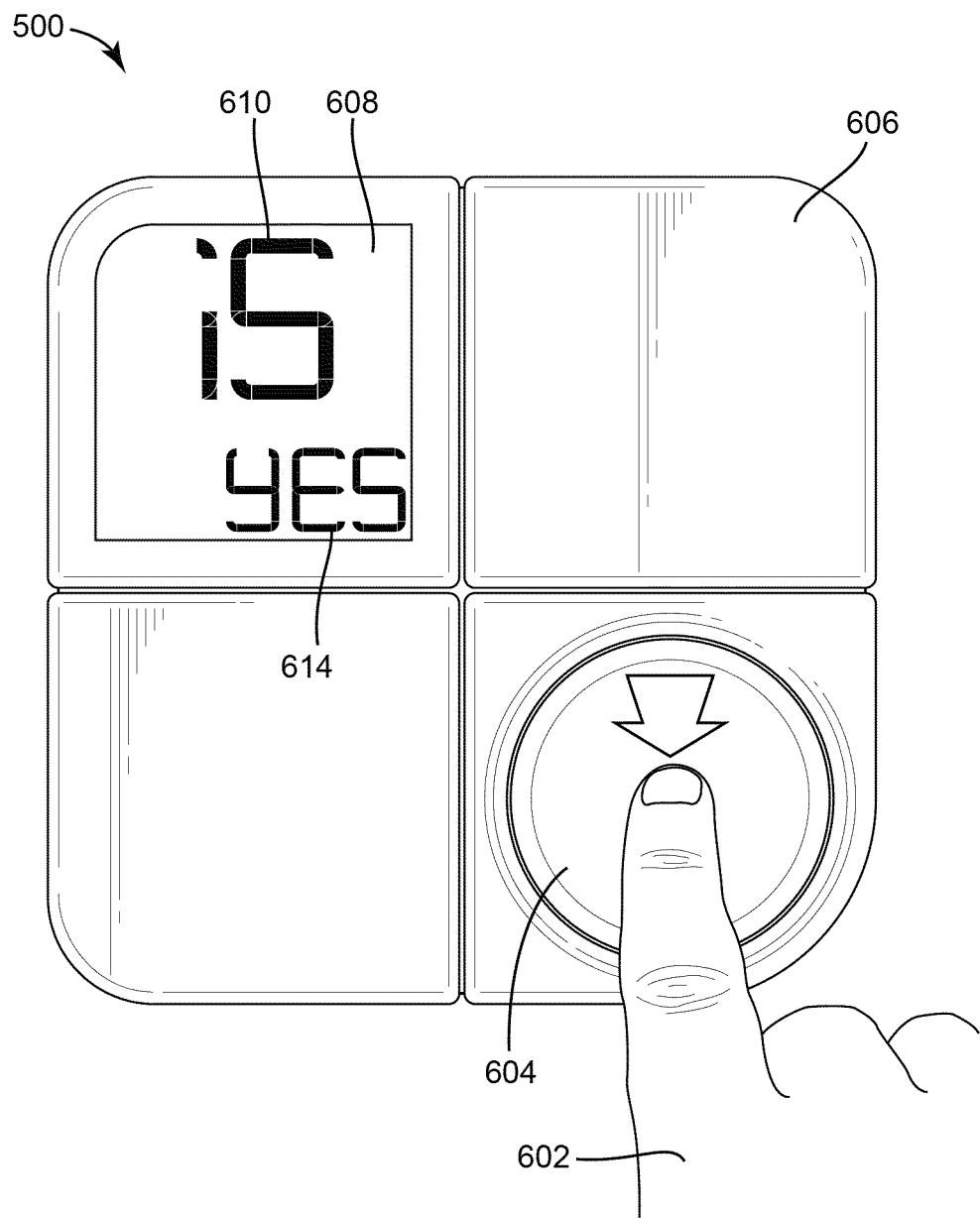
FIG. 27 is a perspective schematic drawing of a user interacting with a thermostat for a residential heating and cooling system, which can be used in the system of FIGS. 3-4, according to some embodiments.
Figure 28:
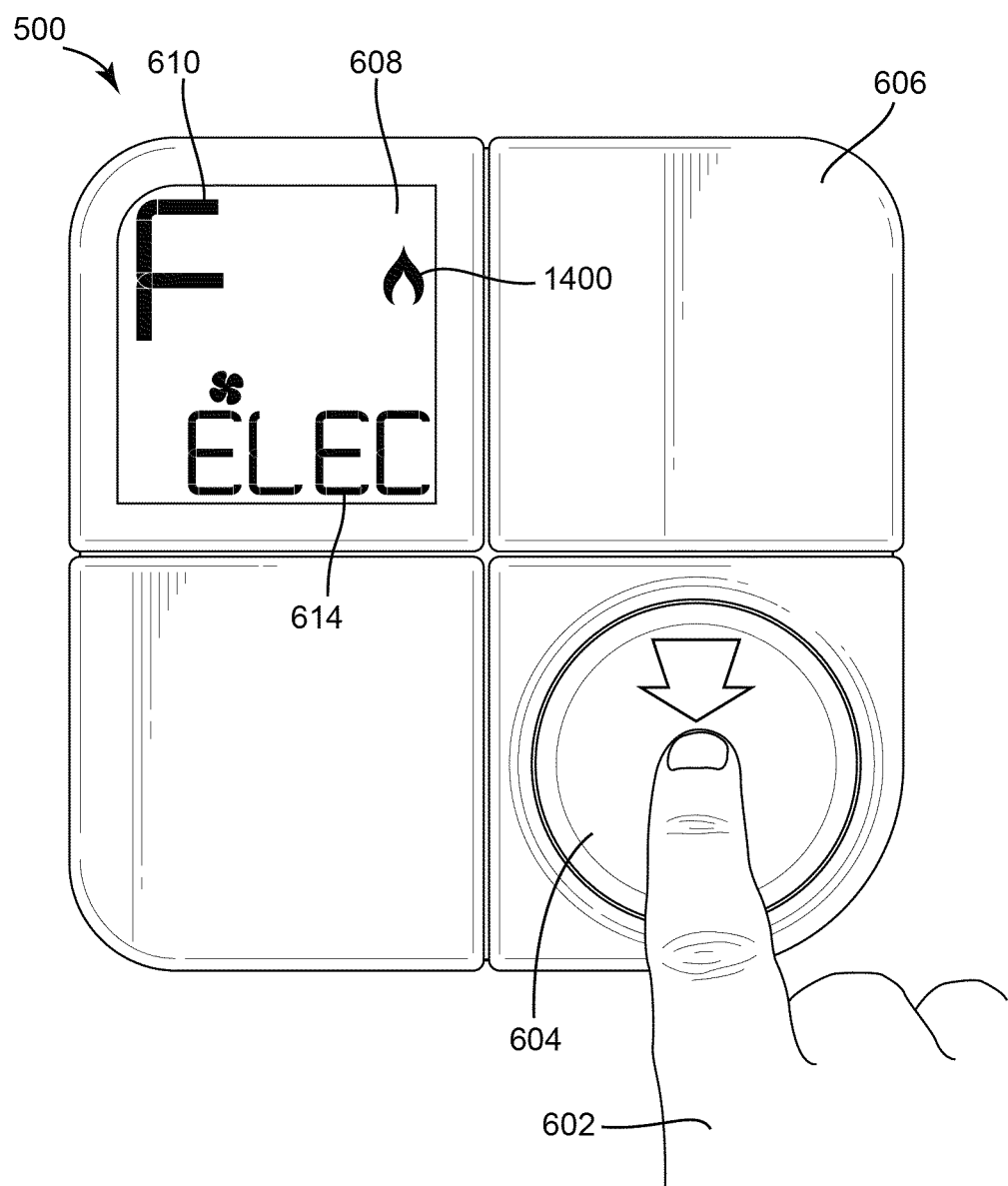
FIG. 28 is a perspective schematic drawing of a user interacting with a thermostat for a residential heating and cooling system, which can be used in the system of FIGS. 3-4, according to some embodiments.
Figure 29:
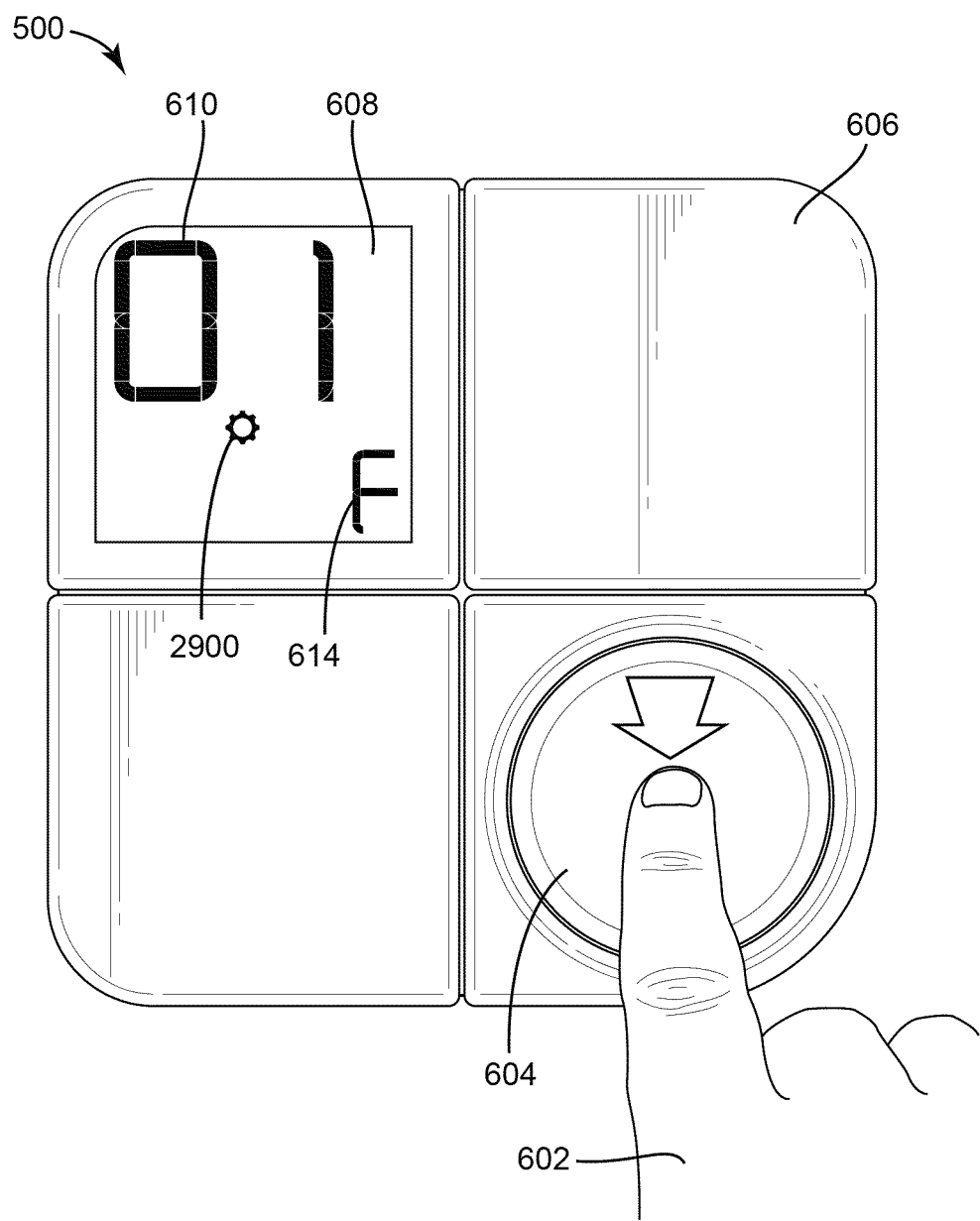
FIG. 29 is a perspective schematic drawing of a user interacting with a thermostat for a residential heating and cooling system, which can be used in the system of FIGS. 3-4, according to some embodiments.

Referring now to FIGS. 27-29, a drawn of user 602 selecting an advanced setting flow for thermostat 500 is shown, according to an exemplary embodiment. In FIG. 27, user 602 presses dial 604 to enter an advanced setting flow. Temperature 610 is displays "i5" and may be indicative of the particular mode or setting selected by user 602. In FIGS. 28-29, further variations are shown of steps and/or methods of selecting an advanced flow setting for thermostat 500. In some embodiments, user 602 selects the "KONOse" (Silver Edition) advanced setting flow for thermostat 500.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A control device for a building, the control device comprising:
a single user interface configured to receive a first signal from a first user input and a second signal from a second user input;
a processing circuit configured to:
receive, via the user interface, both the first signal and the second signal within a first predetermined period of time of receiving the first signal;
perform a first action based on the first signal when the first signal is received before the second signal and not perform a second action in response to the second signal;
perform the second action based on the second signal when the second signal is received before the first signal and not perform the first action in response to the first signal; and
perform a third action, subsequent to the first action or the second action, based on not receiving a third signal subsequent to the first signal or the second signal and via the user interface after a second predetermined period of time, the second predetermined period of time being longer than the first predetermined period of time, wherein:
the first user input is based on a rotation of a mechanical input device on the control device and the second user input is based on a translation of the mechanical input device from a first position to a second position; or
the first user input is based on the translation of the mechanical input device on the control device and the second user input is based on the rotation of the mechanical input device.

2. The control device of claim 1, wherein either the first signal or the second signal navigates, via the user interface, directly to a menu, wherein the menu comprises further navigation to control device settings and does not include further navigation to other menus.

3. The control device of claim 1, wherein the processing circuit is further configured to provide, via the user interface, control device information, wherein the control device information is based on, in part, the first signal and the second signal, wherein the control device information is comprises one or more substantially larger icons, numbers, or letters.

4. The control device of claim 1, further comprising one or more icons, numbers, or letters configured to indicate a mode of operation for the control device, wherein the mode of operation is based on the first signal or the second signal or both.

5. The control device of claim 1, wherein performing the first action based on the first signal further comprises scrolling through temperature setpoints or navigating one or more menu structures.

6. The control device of claim 1, wherein performing the second action based on the second signal further comprises navigating directly to a menu or selecting a temperature setting, wherein the temperature setting comprises a temperature setpoint or a mode of operation.

7. The control device of claim 1, wherein the control device is a thermostat for a heating, ventilation, or air conditioning (HVAC) system.

8. A thermostat for a building, the thermostat comprising:
a user interface comprising a dial, the dial configured to rotate about an axis and translate along the axis, wherein rotating the dial provides a first command signal to a processing circuit and translating the dial provides a second command signal to the processing circuit; and
the processing circuit configured to:
receive, via the user interface, both the first command signal and the second command signal within a first predetermined period of time of receiving the first command signal;
perform a first action based on the first command signal when the first command signal is received before the second command signal and not perform a second action in response to the second command signal; and
perform the second action based on the second command signal when the second command signal is received before the first command signal and not perform the first action in response to the first command signal; and
perform a third action, subsequent to the first action or the second action, based on not receiving a third signal subsequent to the first command signal or the second command signal and via the user interface after a second predetermined period of time, the second predetermined period of time being longer than the first predetermined period of time, wherein:
a first user input is based on a rotation of a mechanical input device on the control device and a second user input is based on a translation of the mechanical input device from a first position to a second position; or
the first user input is based on the translation of the mechanical input device on the control device and the second user input is based on the rotation of the mechanical input device.

9. The thermostat of claim 8, wherein either the first command signal or the second command signal navigates, via the user interface, directly to a menu, wherein the menu comprises further navigation to control device settings and does not include further navigation to other menus.

10. The thermostat of claim 8, wherein the processing circuit is further configured to provide, via the user interface, control device information, wherein the control device information is based on, in part, the first command signal and the second command signal, wherein the control device information is comprises one or more substantially larger icons, numbers, or letters.

11. The thermostat of claim 8, further comprising one or more icons, numbers, or letters configured to indicate a mode of operation for the control device, wherein the mode of operation is based on the first command signal or the second command signal or both.

12. The thermostat of claim 8, wherein performing the first action based on the first command signal further comprises scrolling through temperature setpoints or navigating one or more menu structures.

13. The thermostat of claim 8, wherein performing the second action based on the second command signal further comprises navigating directly to a menu or selecting a temperature setting, wherein the temperature setting comprises a temperature setpoint or a mode of operation.

14. The thermostat of claim 8, wherein the control device is a thermostat for a heating, ventilation, or air conditioning (HVAC) system.

15. A method for controlling building equipment in a heating, ventilation, or air conditioning (HVAC) system, the method comprising:
receiving, via a user interface, both a first command signal and a second command signal within a first predetermined period of time of receiving the first command signal;
scrolling through temperature setpoints or navigating one or more menu structures based on the first command signal when the first command signal is received before the second command signal and not perform a second action in response to the second command signal;
navigating directly to a menu or selecting a temperature setting, wherein the temperature setting comprises a temperature setpoint or a mode of operation based on the second command signal when the second command signal is received before the first command signal and not perform a first action in response to the first command signal; and
selecting a temperature setting responsive to not receiving a third command signal subsequent to the first command signal or the second command signal after a second predetermined period of time, wherein:
a first user input is based on a rotation of a mechanical input device on the control device and a second user input is based on a translation of the mechanical input device from a first position to a second position; or
the first user input is based on the translation of the mechanical input device on the control device and the second user input is based on the rotation of the mechanical input device.

16. The method of claim 15, wherein either the first command signal or the second command signal navigates, via the user interface, directly to the menu, wherein the menu comprises further navigation to control device settings and does not include further navigation to other menus.

17. The method of claim 15, further comprising providing, via the user interface, control device information, wherein the control device information is based on, in part, the first command signal and the second command signal, wherein the control device information is comprises one or more substantially larger icons, numbers, or letters.

18. The method of claim 15, further comprising displaying one or more icons, numbers, or letters configured to indicate the mode of operation for the control device, wherein the mode of operation is based on the first command signal or the second command signal or both.

19. The method of claim 15, further comprising operating within a heating, ventilation, or air conditioning (HVAC) system.

* * * * *